US008834827B2

(12) United States Patent  
Simard et al.

(10) Patent No.: US 8,834,827 B2  
(45) Date of Patent: Sep. 16, 2014

(54) METHOD AND APPARATUS FOR THE CONTINUOUS PRODUCTION AND FUNCTIONALIZATION OF SINGLE-WALLED CARBON NANOTUBES USING A HIGH FREQUENCY PLASMA TORCH

(75) Inventors: Benoit Simard, Orleans (CA); Christopher Thomas Kingston, Gloucester (CA); Stephane Denommee, Carleton Place (CA); Gervais Soucy, Sherbrooke (CA); German Cota Sanchez, Deep River (CA)

(73) Assignees: National Research Council of Canada, Ottawa (CA); Universite de Sherbrooke, Quebec (CA)

( * ) Notice: Subject to any disclaimer, the term of this patent is extended or adjusted under 35 U.S.C. 154(b) by 1481 days.

(21) Appl. No.: 11/886,300

(22) PCT Filed: Mar. 14, 2006

(86) PCT No.: PCT/CA2006/000356  
§ 371 (c)(1),  
(2), (4) Date: Jan. 23, 2009

(87) PCT Pub. No.: WO2006/096964  
PCT Pub. Date: Sep. 21, 2006

(65) Prior Publication Data  
US 2009/0214799 A1 Aug. 27, 2009

(30) Foreign Application Priority Data  
Mar. 14, 2005 (CA) ..................................... 2500766

(51) Int. Cl.  
*D01F 9/12* (2006.01)

(52) U.S. Cl.  
USPC ..................................... 423/447.3; 423/447.1

(58) Field of Classification Search  
USPC .......................................... 423/447.1, 447.3  
See application file for complete search history.

(56) References Cited

U.S. PATENT DOCUMENTS

| 4,816,289 | A | 3/1989 | Komatsu |
|---|---|---|---|
| 5,200,595 | A | 4/1993 | Boulos |
| 5,227,142 | A | 7/1993 | Murai |
| 5,395,496 | A | 3/1995 | Tsantrizos |
| 5,424,054 | A | 6/1995 | Bethune |
| 5,482,601 | A | 1/1996 | Ohshima |
| 5,593,740 | A | 1/1997 | Strumban |
| 5,753,088 | A | 5/1998 | Olk |
| 5,773,834 | A | 6/1998 | Yamamoto |
| 5,788,738 | A | 8/1998 | Pirzada |
| 5,851,507 | A | 12/1998 | Pirzada |
| 5,876,684 | A | 3/1999 | Withers |
| 5,916,642 | A | 6/1999 | Chang |
| 5,997,837 | A | 12/1999 | Lynum |
| 6,063,243 | A | 5/2000 | Zettl |
| 6,099,696 | A | 8/2000 | Schwob |
| 6,149,775 | A | 11/2000 | Tsuboi |
| 6,156,256 | A | 12/2000 | Kennel |
| 6,183,714 | B1 | 2/2001 | Smalley |
| 6,221,330 | B1 | 4/2001 | Moy |
| 6,254,940 | B1 | 7/2001 | Pratsinis et al. |
| 6,261,484 | B1 | 7/2001 | Phillips et al. |
| 6,303,094 | B1 | 10/2001 | Kusunoki |
| 6,331,209 | B1 | 12/2001 | Jang |
| 6,331,690 | B1 | 12/2001 | Yudasaka |
| 6,333,016 | B1 | 12/2001 | Resasco |
| 6,350,488 | B1 | 2/2002 | Lee |
| 6,358,375 | B1 | 3/2002 | Schwob |
| 6,361,861 | B2 | 3/2002 | Gao |
| 6,395,197 | B1 | 5/2002 | Detering et al. |
| 6,444,864 | B1 | 9/2002 | Knight et al. |
| 6,455,021 | B1 | 9/2002 | Saito |
| 6,495,116 | B1 | 12/2002 | Herman |
| 6,692,717 | B1 | 2/2004 | Smalley |
| 6,761,870 | B1 | 7/2004 | Smalley |
| 6,863,942 | B2 | 3/2005 | Wang |
| 6,878,360 | B1 | 4/2005 | Ohsaki |
| 6,884,404 | B2 | 4/2005 | Anazawa |
| 6,994,837 | B2 | 2/2006 | Boulos |

(Continued)

FOREIGN PATENT DOCUMENTS

| CA | 2331278 | 8/2001 |
|---|---|---|
| CA | 2424969 | 4/2002 |

(Continued)

OTHER PUBLICATIONS

IPRP-and-ISR-on-PCT-CA2006-000356 dated Jun. 15, 2007 and Jun. 20, 2006.  
Hager JW. (1999) Nanotube synthesis using hydrocarbon precursors and induction-coupled plasma technology. 24th Proceedings of Bienn Conference on Carbon. vol. 1, 78-79.  
Cota G.; Continuous Synthesis of Nanocarbons Using an Induction Plasma React 8th Intemationa Conference on Advanced Materials (IUMRS-ICAM) (Osaka, Japan Oct. 8-13, 2003).  
Klotz H.-D. et al; Synthesis and characterization of nanoscaled and nanostructured carbon containing materials produced by thermal ; Applied Surface Science 179, (2001) 1-7.  
Catalytic Production of Nanotubes by Pyrolysis of Carbon Black and Hydrocarbons by Induction Plasma, Article submitted for International Symposium on Gas Discharges, Toulous.

(Continued)

*Primary Examiner* — Stuart Hendrickson  
(74) *Attorney, Agent, or Firm* — Cermak Nakajima McGowan LLP; Adam J. Cermak

(57) ABSTRACT

An integrated method and apparatus to continuously produce purified Single Wall Carbon Nanotubes (SWNT) from a continuous supply of solid carbon powder fed to an induction plasma torch. The apparatus includes a reactor body disposed to maintain laminar flow of gases with the torch body and coupled to a quenching body where temperature and residence time is controlled. Conveniently, functionalization may take place in the quenching body. The torch is operated with an argon carrier gas, an argon stabilizing gas and a helium sheath gas. Solid carbon reactants are preferably mixed with at least two metal catalysts containing nickel and cobalt with additional metal oxides of yttrium and cerium being desirable.

24 Claims, 11 Drawing Sheets

(56) References Cited

U.S. PATENT DOCUMENTS

| | | | |
|---|---|---|---|
| 2001/0009693 A1 | 7/2001 | Lee | |
| 2002/0102196 A1 | 8/2002 | Smalley | |
| 2002/0155059 A1 | 10/2002 | Boulos | |
| 2003/0082094 A1 | 5/2003 | Loutfy | |
| 2003/0211030 A1 | 11/2003 | Olivier | |
| 2004/0109814 A1 | 6/2004 | Simard et al. | |
| 2004/0245088 A1 | 12/2004 | Gardner | |
| 2006/0127299 A1 | 6/2006 | Harbec | |

FOREIGN PATENT DOCUMENTS

| | | | |
|---|---|---|---|
| EP | 1 046 613 A2 | 10/2000 | |
| EP | 1 061 041 A1 | 12/2000 | |
| EP | 1 129 990 | 9/2001 | |
| JP | 06056414 | 3/1994 | |
| JP | 07061803 | 10/1996 | |
| JP | 09188509 | 4/1998 | |
| JP | 2003/054924 | 2/2003 | |
| WO | WO 93/23331 | 11/1993 | |
| WO | 97/09272 A1 | 3/1997 | |
| WO | WO/01/49599 | 12/2001 | |
| WO | WO 03/062146 | 7/2003 | |
| WO | WO03062146 A1 * | 7/2003 | ............ C01B 31/02 |
| WO | WO/03/038163 | 8/2003 | |
| WO | 03/095362 A2 | 11/2003 | |
| WO | 2005/007565 | 1/2005 | |
| WO | WO/2007/084176 | 7/2007 | |
| WO | WO/2008/005612 | 1/2008 | |

OTHER PUBLICATIONS

Cota-Sanchez,. G et al. Induction plasma Synthesis of Fullerenes and Nanotubes Usingcarbon Black-Nickel Particles; Carbon 43: 3153-3166. www.sciencedirect,com.

Smiljanic O , , Gas-Phase synthesis of SWNT by an atmospheric pressure plasma jet; Che. Phys. Letters 356 , (2002) 189-193 (Apr. 22, 2002).

Guo T., et al, Catalytic growth of single-walled nanotubes by laser vaporization,; Chem Phy lett243. 49-54 , (Sep. 1995).

Liu B., Synthesis and characterization of single-walled nanotubes produced with Ce/Ni as catalysts: Chem. Phys. Lett 320. pp. 365; (Apr. 2000).

Cota G.. et al., Synthese par plasma thermique de nanostructures de carbone; Colloquede l'IMSI; (Universite de Sherbrooke, Nov. 5, 2003).

Cota G., Synthese de nanotubes par plasma d'induction a haute frequence; dans le cadre deNanoQuebec (INRS, Montreal). Jun. 2003.

Huczko A. et al., Plasma Synthesis of Nanocarbons; High Temp. Material Processes 6; (2002) 369-384.

Cota-Sanchez, G et al. Effect of Iron Catalyst on the Synthesis of Fullerenes and CarbonNanotubes in Induction Plasma, J. Phys. Chem 6108, (50): 19210-19217.

Delzeit L. et al., Growth of multiwall carbon nanotubes in an inductively coupled plasma reactor, Journal of Applied Physics vol. 91. No. 9 , (May 1, 2002.

Smilganic O et al. M Journal of Nanoscience and Nanotechnology , 2004 vol. 4 No. 8 pp. 1005-1013.

Cota G et al., Continuous Synthesis of Nanocarbons Using an Induction Plasma Reactor MRS Trans Mat Res Soc Japan Mar. 29, 2004, (2004) Mars 2004.

Sumio Lijima & Toshinari Ichihashi,Single-shell carbon nanotubes of 1-nm diameter, Nature. Vo. 363 , (Jun. 17, 1993).

Bethune D.S. et al., Cobalt-cataysed growth of carbon nanotubes with single-anomic-layer walls, Nature. vol. 363 p. 605, (Jun. 17, 1993).

Conrads H., et al, Plasma generation and plasma sources, PlasmaSources Sci Technol. 9 (2000) 441-454.

Melro Sosa L. et al., Production of carbon black using induction plasma technology Proc. 15th Int. Sym Plasma Chemistry (ISPC)vol. 7: pp. 2879 (Jul. 2001).

Cota-Sanchez German;Synthese de nanostructures de carbone en utilisant un reacteur a plasma d'inducton . . .; These de doctorat Universite de Sherbrooke , (Mar. 3, 2003).

Wang, C. et al.; "Synthesis of Fullerenes from Carbon Powder by Using High Power . . . "; Thin Solid Films 390: pp. 31; Dec. 2001.

Sen, Rahul; "Carbon Nanotubes by the Metallocene Route"; Chemical Physics Letters; Mar. 12, 1997.

Saito, Yahachi; "Nanoparticles and Filled Nanocapsules"; Pergamon—Carbon, vol. 33, No. 7, pp. 979-988, (1995).

Kitiyanan, B., et al; "Controlled Production of single-wall Carbon Nanotubes by Catalytic Decomposition of Co on . . . "; Chem. Phys. Letters 317 (2000) 497-503.

Cheng, H.M. et al; Large-scale and Low-cost Synthesis of Single-Walled Carbon Nanotubes by the . . . ; Applied Physics Letters vol. 72, No. 25. Pub. Jun. 22, 1998.

Alexakis, T, et al; "Synthesis of Fullerenes via the Thermal Plasma Dissociation of Hydrocarbons" Appl. Phys. Lett 70, pp. 2102 Apr. 1997.

Ando, Y., et al, "Mass Production of Single-wall Carbon Nanotubes by the Arc Plasma Jet Method", Chem. Phys. Letters 323 pp. 580-585, (2000).

Saito, Y., "Nanoparticles and filed Nanocapsules", Carbon. 33, pp. 979 (1995).

Kiang, C. et al; "Catalytic Effects of Heavy Metal on the Growth of Carbon Nanotubes and Nanoparticles" J. Phys. Chjem. Solids 57, pp. 35 (1996).

Shi, Zujin et al; "Large Scale Synthesis of Single-wall Carbon Nanotubes by Arc-discharge Method" J. Phys. Chem. Solids 61 pp. 1031-1036 (2000).

Flahaut, E. et al; "Synthesis of single-walled cargbon nanotubes Using Binary (Fe, Co, Ni) Alloy Nanoparticles Prepared in situ . . . " Chem. Phys. Lett. 300, pp. 236-242, (1999).

Bethnue, D.S., "Carbon and Metals: a Path to single-wall Carbon Nanotubes", Phys. B 323 pp. 90-96, (2002).

Huczko, A. et al; "Influence of Fe and Co/Ni on Carbon Arc Plasma and Formation of Fullerenes and Nanotubes" J. Phys. Chem A (2000) 104, 10708-10712.

Sen, R., et al. "Metal-filled and Hollow Carbon Nanotubes Obtained by the Decomposition of Metal-containing Free Precursor . . . " Chem. Mater. 9, pp. 2078 (1997).

Hernadi K., "Fe-Catalyzed Carbon Nanotube Formation" Carbon Vo. 34, No. 10, pp. 1249-1257 (1996).

Takizawa M. et al. "Change of Tube Diameter Distribution of Single-wall Carbon Nanotubes Induced by changing the Bimetallic . . . " Chem. Phys. Lett. 326 2000, 351-357.

Cheng H.M. et al; "Large-scale and Low-costs syhnthesis of Single-walled Carbon Nanotubes by the Catalytic Pyrolysis . . . " Appl. Mhys. Lett. Vo. 72, No. 25 (1998) p. 3282.

Lange, H. et al; "Studies of Carbon Arc Plasma Doped With Fe and Co/Ni During the Formation . . . " Proceedings of 14th Int. Sympo. on Plasma Chem. Vo. IV (1996).

Zhang M., et al; "Single-wall Carbon Nanotubes: a High Yield of Tubes Through Laser Ablation of a Crude-Tube Target" Chem. Phys. Lett. 336 (2001) pp. 196-200.

Extended European Search Report dated Jun. 14, 2011 on corresponding European application 06705309.0.

Office Action dated May 26, 2011 on corresponding Canadian application 2,645,330.

* cited by examiner

METHOD AND APPARATUS FOR THE CONTINUOUS PRODUCTION AND FUNCTIONALIZATION OF SINGLE-WALLED CARBON NANOTUBES USING A HIGH FREQUENCY PLASMA TORCH

TECHNICAL FIELD

This invention relates to the production of single-walled carbon nanotubes and in particular relates to a reactor for the continuous production of single-walled carbon nanotubes (SWNT) on an industrial scale.

BACKGROUND ART

Various methods for producing carbon nanotubes have been developed, notably by chemical vapour deposition (CVD) and electric arc discharge. In the CVD method, a carbon containing gas is catalytically converted by a metal catalyst into carbon nanotubes and other carbon nanostructures. In the electric arc method, a direct current (DC) electric discharge is generated between a pair of graphite electrodes which evaporates carbon from the electrode surfaces.

The electric arc process is non-continuous since it must be stopped to replace the carbon electrodes after they are consumed. CVD processes are also typically non-continuous processes, relying on surface deposition and growth of the carbon nanotubes, and also suffer from the drawback that single-walled carbon nanotubes are much more difficult to produce than multi-walled carbon nanotubes.

Recent work described in WO 03/095362 describes a method for continuously producing single walled carbon nanotubes in a plasma torch in which a secondary plasma is formed by contacting a carbon-containing substance with a primary plasma formed at the plasma discharging end of the plasma torch. While the carbon containing substance is described to include solid carbon as well as liquid or gaseous sources, the latter is preferred and the supporting example of a carbon-containing substance is ethylene gas. It is submitted that such apparatus does not attain sufficiently high temperatures in the primary or secondary plasma to vaporize solid phase carbon and/or catalyst sources. The sole usage of solid precursors described in WO 03/095362 is a low vapour pressure organometallic compound which is vaporized prior to the plasma and delivered to the plasma in a gaseous phase.

An object of this invention is to provide a reactor and process for the continuous production of high purity single-walled carbon nanotubes.

DISCLOSURE OF THE INVENTION

In accordance with one aspect of the invention, the process takes place in a reactor having a radio frequency (RF) inductively coupled thermal plasma torch for vaporizing a mixture of reactants at a very high temperature suitable for vaporizing solid carbon. The RF plasma torch is characterized by a direct feed of the reactants into the plasma discharge in a carrier gas to axially or radially inject carbon and catalyst raw materials. A sheath gas for promoting laminar flow in the plasma and reactor can conveniently include reactive gases such as carbon monoxide. The reactants are preferably solid carbon sources consisting of mainly amorphous carbon black or graphite and will include at least two metals, two metal oxides, two metal salts, or a mixture of metal and/or metal-oxides and/or metal-salt catalysts, preferably containing a mixture of Ni and Co and also oxides of yttrium and cerium. The roles of the metal containing catalysts are to regulate the growth of SWNT, lower the growth temperature window and, to radiatively condition the plasma for efficient coupling of electrical energy into the plasma, which in turns favour the former two roles. The induction plasma torch is operated below or near atmospheric pressure to maintain a laminar flow which favours nanotube growth.

The reactor body adjacent the induction plasma torch is characterized by refractory walls which maintain high temperatures favourable to nanotube growth and annealing.

In accordance with another aspect of the invention, the reactor body has access ports disposed along its length whereby the temperature profile in the reactor may be controlled. The access ports may also be used to allow for selective oxidation of any carbon soot formed in the reactor whereby impurity carbons (carbonaceous materials not in the form of single-walled carbon nanotubes) are burned, for example, in water vapour, at a temperature of typically 200-500° C., to concentrate the amount of single-walled carbon nanotubes in the soot.

In accordance with a third aspect of the invention, the reactor includes a physical filtration system disposed above a removable soot collection zone, whereby soot may be physically trapped on filters from soot-carrying exhaust gas and dislodged by blowing gas into the filtration system counter-current to said exhaust gas.

In yet another aspect of the invention, the single-walled carbon nanotubes may be functionalized by adding selected halogen reactants such as $F_2$, $Cl_2$, and $Br_2$ into the reactor using said access ports, or by adding reactants which thermally decompose in the reactor to produce gaseous radical species for functionalizing the single-walled carbon nanotubes.

BRIEF DESCRIPTION OF THE DRAWINGS

In order that the invention may more clearly be understood, a preferred embodiment of the invention is described below with reference to the accompanying drawings in which:

FIG. 1b is a sectional view of the reactor of FIG. 1a;

BEST MODE FOR CARRYING OUT THE INVENTION

Figure 1A:
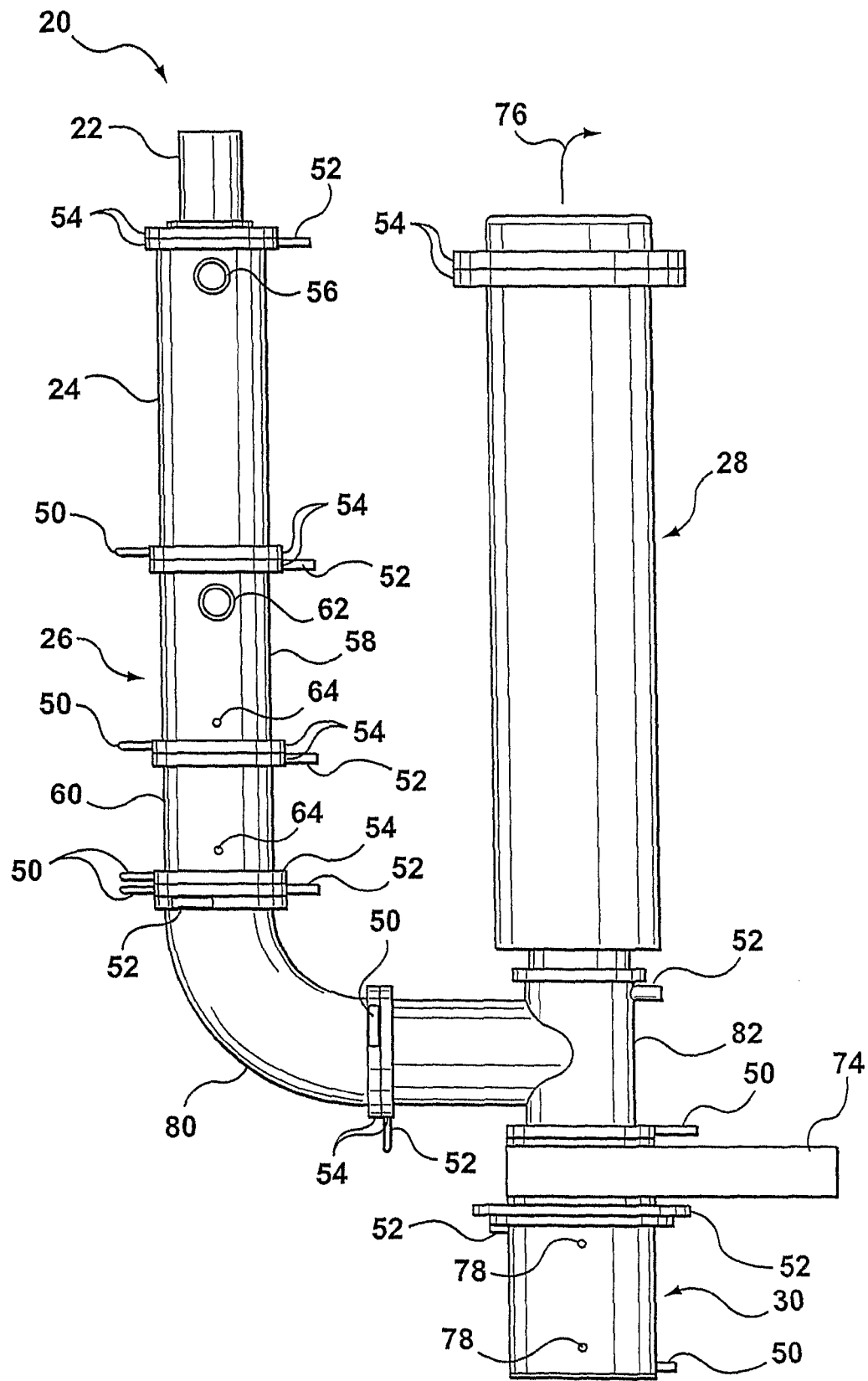
FIG. 1a is a reactor for the production of single-walled carbon nanotubes.
Figure 1B:
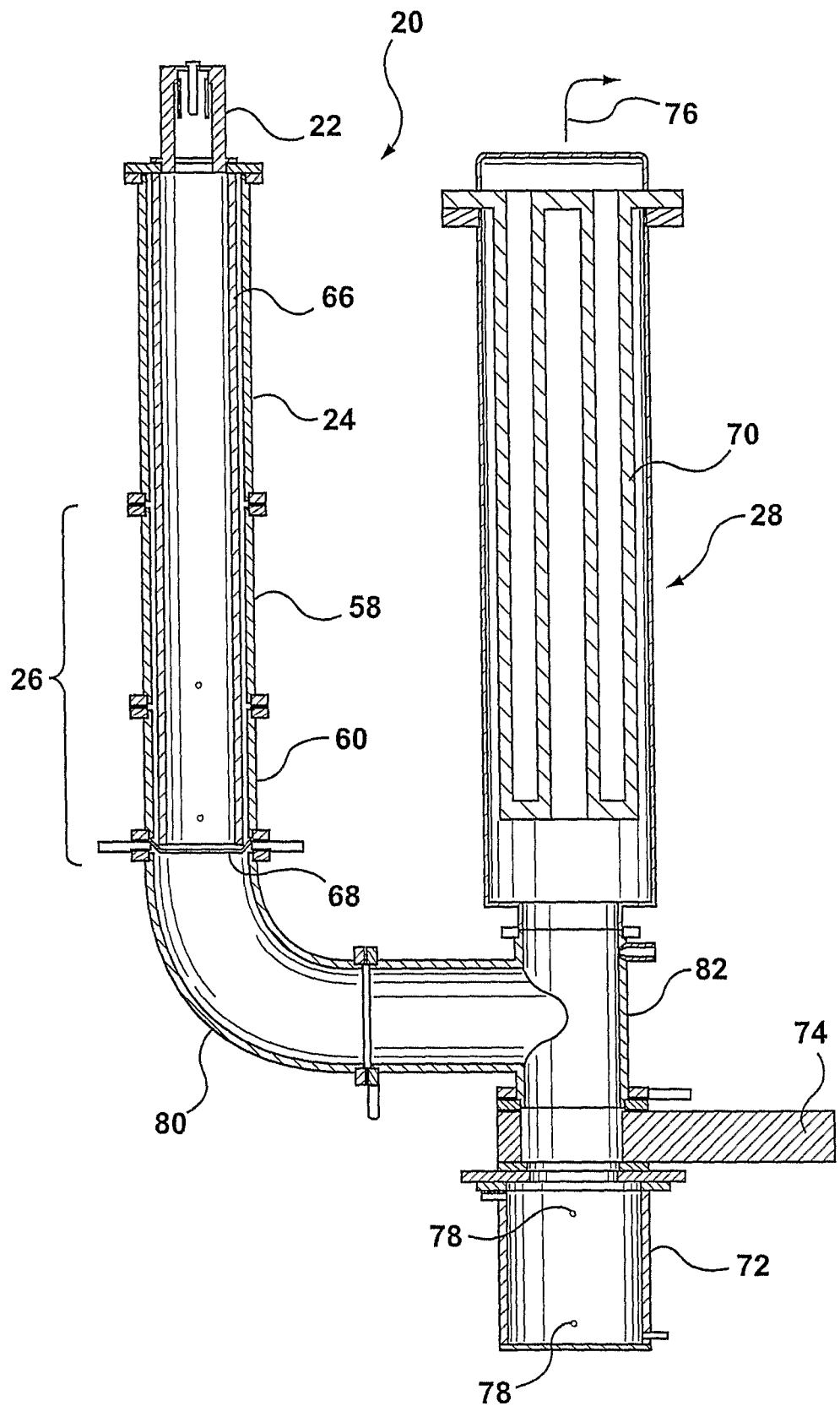

The invention is described more fully with reference to supporting examples which describe experiments conducted in a reactor generally illustrated in the accompanying drawings of FIG. 1a and FIG. 1b.

Overview of the System

The method and apparatus used to synthesize single-walled carbon nanotubes (SWNT) in accordance with the invention is based on the vaporization of carbon and catalyst-metal feedstock using a radio frequency (RF) inductively coupled plasma reactor. Such a system is ideally suited to provide the necessary physical and chemical phenomena necessary for the efficient synthesis of SWNT. Specifically: 1) the generation of carbon and metal vapour within the plasma, 2) the physical and chemical evolution of the carbon and catalyst species, and 3) high temperatures and controlled temperature gradients. The design and geometry of the apparatus incorporate a number of unique features which are not possible in existing technologies for the production of SWNT and which enable true continuous operation and true large volume (kg quantities) production capacities.

Unique Induction Plasma Reactor Properties

This Radio frequency (RF) inductively coupled plasma reactor according to the invention presents remarkable advantages with respect to other plasma systems including direct current (DC) and microwave (MW) plasma torches. RF plasma reactor advantages can be summarized as follows:
a) RF plasma torches can reach higher temperatures than other plasmas (about 10 000 K). This favours the vaporization of high throughputs of reactants of any form: solid, liquid, and gas. High temperatures also favour the production of SWNT precursors such as $C_2$ and $C_3$ species and enhance carbon-carbon reactions during formation of SWNT.
b) RF plasma reactor presents a very large plasma volume, which allows processing very large amounts of reactant mixture (at least 1-4 g/min).
c) RF plasma process can be operated at very large production rates with high yield (soot recovering of 90 wt % of fed mass).
d) RF plasmas have a low velocity plasma gas compared to a DC plasma, making the operating conditions of the plasma reactor more easily controllable when a large feed rate of the reactant mixture is used (feed rates of plasma gas, feed rate of raw materials, plasma power parameters, reactor pressure).
e) RF Plasma reactor geometry and configuration favours high carbon vapour pressures in the reactor regions where the highest temperatures are present.
f) Reactor geometry combined with below or near atmospheric pressure allows maintaining a laminar flow regime in the hot gas, favouring nanotubes growth.
g) The absence of electrodes allows the use of different types of plasma gas and the product purity is higher.
h) The large residence time of the carbon compounds inside of the plasma flame favours the complete vaporization of the reactant mixture, the carbon-carbon reactions at high temperatures and the formation of nanotubes.
i) Refractory walls allow maintaining very high background temperatures (several thousand degrees) in the reactor section, which favour nanotube growth and annealing.
j) Capacity for functionalization and purification of the SWNT within the reactor as they are grown.
k) High temperature filtration to improve temperature gradients and SWNT crystallinity.
l) Collection and removal of SWNT material without terminating the production process allowing for very long-term continuous operation.
m) Specific combinations of catalysts can enhance the plasma radiation, which in turn produces a sort of photocatalytic effect during the synthesis of SWNT.
n) RF plasma processes are reliably reproducible.
o) RF plasma processes can be operated in a truly continuous regime.
p) High concentrations of SWNT: >30 wt %.

Experimental Set-Up

FIGS. 1a and 1b show schematics of an apparatus made according to the invention for the production of SWNT and generally indicated by reference numeral 20. The induction plasma apparatus is composed of three sections (see FIG. 1a). The first section includes the RF induction plasma torch 22 used to vaporize the mixture of reactants, and the reactor 24 where the extended high temperature processing of the vaporized reactants takes place. The second section is the quenching system 26 where the growth of SWNT is terminated and where possible secondary chemical processing may be initiated, such as in-situ purification or functionalization. The third section contains the filtration 28 and collection 30 system used to separate the products from the plasma and quenching gases.

Figure 2:
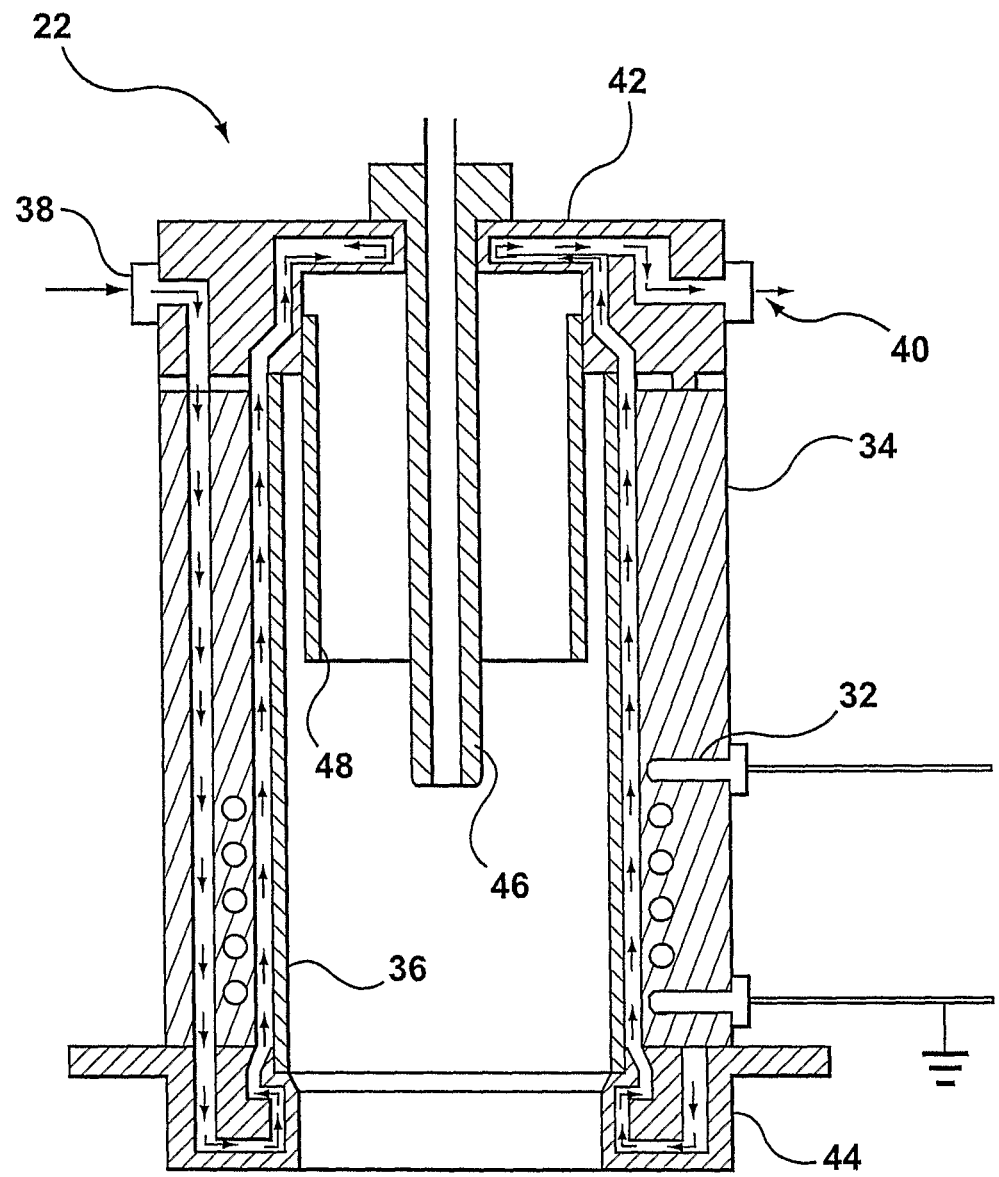
FIG. 2 is an R F Inductively Coupled Plasma Torch TEKNA PL-50 (Tekna Plasma Systems, Inc.) for use with the reactor of FIGS. 1a, 1b.

The induction plasma torch shown in more detail in FIG. 2 is a Tekna PL-50 (Tekna Plasma Systems, Inc.) composed of a five-turn coil 32 disposed in a polymer torch body 34 and surrounding a central ceramic tube having a 50 mm internal diameter which defines a plasma confinement tube 36. The plasma torch 22 is driven by a Lepel 60 kW RF power supply (not shown) and the torch body 34 has a cooling water inlet 38 and a cooling water outlet 40 formed in a gas distribution head 42 disposed in fluid communication above the torch body 34. An exit nozzle 44 completes the torch body 34 and also has passages in fluid communication with the cooling water inlet 38 and cooling water outlet 40. Many different plasma gases can be used, including inert gases like argon and helium or hydrocarbon species such as acetylene or methane, or mixtures thereof. This allows for precise control of the plasma temperature and particle density and provides the opportunity to incorporate carbon feedstock materials directly in the plasma gas. The types and flow rates of typical plasma gases used in the experimental tests are shown in Table 1. Due to the robust and versatile functionality of the RF induction plasma torch and extremely high achievable plasma temperatures, carbon powders and other solid precursors can also be injected and completely vaporized. Carbon and catalyst powder mixtures can be delivered using a powder feeder at various rates to control the reactant concentration within the plasma. These solid reactants are introduced axially through a water-cooled central probe 46 located at the centre of the plasma torch 22. In the following examples, two different grades of carbon black have been used as a carbon source for the synthesis of SWNT. On the other hand, various metals and metal-oxide compounds have been used as catalysts. For instance, nickel, cobalt and cerium and their combinations have been shown to produce good results in the synthesis of SWNT. The particle size of catalysts should be smaller than 5 µm in order to obtain the optimal results. The gas distribution head 42 supports an intermediate tube 48 which is shorter in length than the central probe 46 and is disposed between the central probe 46 and the plasma confinement tube 36 to separate a plasma sheath gas and stabilizing gas as will be described later.

The reactor and quenching system components of the apparatus 20 are constructed of stainless steel wrapped with a water-cooled jacket having water inlets 50 and outlets 52 in water-cooled coupling flanges 54 to maintain the integrity of the system under the extremely high temperatures, as well as to provide the possibility for rapid cooling of the process.

The reactor 24 is cylindrical in shape, 500 mm in length, with an internal diameter (ID) of 150 mm. The primary purpose of the reactor 24 is to provide a suitable environment (in terms of temperature, pressure, volume) for the generation of a stable induction plasma and the subsequent physical and chemical processes necessary for the formation of SWNT. The reactor 24 includes a 38 mm multi-purpose access port 56 which can be used for visual observation of the plasma, spectroscopic investigation of the plasma, introducing materials into the plasma, as well as other possible uses. Spectroscopic measurements are a crucial tool for the monitoring of reactant components, concentrations, and temperatures and providing critical feedback for the further optimization of the experimental parameters necessary to favour SWNT production.

The quenching system 26 is composed of two cylindrical segments 58, 60 with 300 mm and 200 mm lengths, respectively, and ID's of 150 mm. These segments 58, 60 can be used individually or in tandem to adjust the overall physical length of the active pathway within the apparatus. The main role of the quenching system is to terminate the growth process of the SWNT. This can be achieved several ways. First, the quenching system 26 is sufficiently separated from the RF induction plasma torch 22 that natural cooling processes may reduce the ambient temperatures to the point where they are unfavourable for the continued growth of SWNT. It is also possible that inert gases can be injected through multi-purpose ports to rapidly cool the reaction mixture and immediately terminate all reactions. The longer of the two segments includes a similar 38 mm multi-purpose port 62 to the reactor segment which can be used for similar purposes. Both quenching segments 58, 60 also possess a 10 mm multi-purpose port 64 which will primarily be used for the insertion of thermocouples into the apparatus to evaluate temperatures and temperature profiles, and the introduction of chemical species for the purpose of performing in-situ chemistry on the SWNT as they are formed. This chemistry can include oxidative removal of the by-product or impurity carbons (which are carbonaceous materials which have not been formed into SWNT by the plasma process) with a variety of oxidizing agents including, but not limited to, water, air, oxygen, ozone, carbon dioxide, and carbon monoxide. Such processing results in the enhancement of the fraction of SWNT in the final product, and is therefore referred to as in-situ or in-line purification. Additionally, this chemistry could include the introduction of reactive species for the purpose of chemically functionalizing the SWNT. The possible reactive species are numerous and diverse and would be chosen based on the desired functionality to be added to the SWNT. Examples of such functionality could be halogen compounds, alcohols, acids, organic chains and rings, amine groups, peroxide compounds and azo compounds. The ability to both produce the SWNT and perform such chemistry on the SWNT as or immediately after they are grown in a single apparatus is a unique feature that cannot be reproduced within any known existing process for the production of SWNT.

High temperatures and controlled temperature gradients are extremely important for the efficient synthesis of SWNT. As shown in FIG. 1*b*, the apparatus incorporates the use of interchangeable refractory insert tubes 66 made of graphite within the reactor and quenching zones to allow for control over maximum achievable temperature, background system temperature, and rate of cooling of temperature gradients. Conveniently, a carbon containing refractory will minimize contamination of the plasma. The internal diameter of the graphite tubes can be varied from 60-100 mm which influences the plasma volume, particle density, and maximum plasma temperature. The graphite tube wall thickness can be varied from 25-65 mm to change the background heat loading which determines the background system temperature. The length of the graphite tube can be varied from 200-1000 mm to control the residence time of the reaction mixture in the high temperature background and determines the temperature gradients along the reaction path of the apparatus. The graphite tubes are held in place by a water-cooled support bridle 68.

A minimum exit temperature from the quenching body will be indicative of having reached a pre-determined residence time sufficient for growing single-walled carbon nanotubes. Temperature is also an integral parameter in the effectiveness of the in-line chemistry. The proposed types of chemical processes occur most efficiently in temperature ranges between 50-2500° C. depending on the reactive species, more typically between 200-500° C. using water, oxygen, and/or air. The precise location within the apparatus where this chemistry will be initiated is highly dependent on the configuration of the graphite insert tubes 66. The location of the in-line chemical processing can be varied by directly injecting the reagents into different access ports 62, 64, or by using a customized injection probe in combination with the different access ports.

The special design of the induction plasma torch 22 allows using a large variety of plasma gases to control the chemistry of the process by keeping a close control of the gas flow pattern in the discharge region. Currently, three different gas streams are introduced into the induction plasma torch 22 (see Table 1 and FIG. 2). The central or stabilizing gas, which has a swirl velocity component, is used to stabilize the plasma between the central probe 46 and the intermediate tube 48 and is admitted to the torch 22 through first gas inlet means (not shown) in the gas distribution head 42. The powder or carrier gas is used to axially inject carbon and catalyst raw materials down the central probe 46. The sheath gas is admitted to the plasma torch 22 through second gas inlet means (not shown) in the gas distribution head 42 and is used to protect the plasma confinement tube 36 from the high temperature of the discharge, and at the same time, to promote laminar flow in the plasma zone and down the reactor 24 by establishing a jacket of directional high-velocity gas along the wall perimeter. At sufficient displacement from the plasma torch 22 (displacement depends on specific gas flow rates but typically corresponds to locations within the quenching system) the sheath gases will mix with the main reaction mixture allowing for chemical reactions to occur. While the central gas is used essentially for the plasma stabilization, the powder and the sheath gases can be also used for the introduction of chemically reactive gases to promote chemical processes. For example, the chemical processes for SWNT synthesis can also be initiated by incorporating reactive species such as carbon monoxide into the sheath gas of the RF induction plasma torch. The injection of CO in the plasma sheath gas favours the formation of carbon radical species, such as C, $C_2$ and $C_2O$, due to the CO plasma decomposition at high temperatures. The formation of SWNT is then enhanced because the higher carbon vapour pressure present into the system and the highly reacting role of these active carbon-containing materials in the growing of SWNT. A similar effect can be found by injecting metallic oxide catalysts instead of pure metal particles. Because the high plasma temperatures (10 000 K), metal oxide and carbon particles will evaporate, react and eventually promote the formation of these building materials (C, $C_2$ and $C_2O$).

The filtration 28 and collection 30 system is composed of a filter unit 70 and a removable collection bucket 72 separated by a large diameter valve 74. The filter unit 70, manufactured by Pall Corporation (P/N 7BBD70002-116; S/N TSJ-Z0984), contains 4 porous ceramic or stainless steel filter elements (60-mm OD, 850 mm long, rated at 2.8 µm in gas service) which separate the solid SWNT products from the gas-phase species. The residual gases are exhausted as indicated by arrow 76 through a vacuum pump (not shown). The design allows for an inline gas chromatograph for analysis of the exhaust gases. The construction of the filter unit 70 allows for its operation up to temperatures of 1000° C., which is useful for controlling the overall temperature gradients and profiles within the entire apparatus, as well as annealing the SWNT in-situ as they are collected to increase their crystallinity and help remove impurity carbons. When sufficient deposits have been collected on the filter elements, normal filtration operation continues in two filter elements, while a "blow-back" procedure is performed in the two other elements, whereby high-pressure inert gas (He, Ar, $N_2$) is injected from the exhaust side of the filter unit 70 through the filter elements dislodging the SWNT deposits. This "blow-back" procedure assures a very long-term continuous operation of the entire plasma system. During this process the valve 74 is opened to allow the SWNT material to fall and collect in the collection bucket 72. The valve 74 is then closed and normal operation with all filter elements continues until a new "blow-back" period is necessary. The collection bucket 72 is equipped with a double-wall cooling jacket, a quick-connect flange to mate with the underside of the valve 74, and four 10 mm multi-purpose ports 78 which are used for thermocouples, pressure monitoring, purge gas inlet, and vacuum pumping port. This design allows for rapid cooling of the SWNT, subsequent removal of the entire bucket 72 from the apparatus for SWNT collection, and reattachment of the bucket 72 without interruption of the operation of the entire system.

The overall geometry of the apparatus 20 is chosen for efficiency and ease of use. The linear vertical arrangement of the reactor 24 and quenching system 26 allow for laminar flow of the reaction mixture. The linear vertical arrangement of the filtration system 28 and collection system 30 allow for gravitational assistance in collection of the SWNT on blow-back procedures. A rounded elbow 80 disposed between the second segment 60 of the quenching system 26 and a tee 82 disposed between the filtration system 28 and collection system 30 couple the Reactor+Quench and Filter+Collection halves of the system with minimum disruption to the flow dynamics within the apparatus. Changes to the system geometry may be implemented if they are deemed favourable to system operation.

TABLE 1

Typical Gases and Flow Rates Used in the PL-50 Induction Plasma Torch

| Plasma Gas | Type of Gas | Gas Flow Rate (slpm) |
|---|---|---|
| Central | Argon | 30 |
| Sheath | Helium | 120 |
| Powder | Argon, Helium | 2-10 |

Carbon Sources

Figure 3:
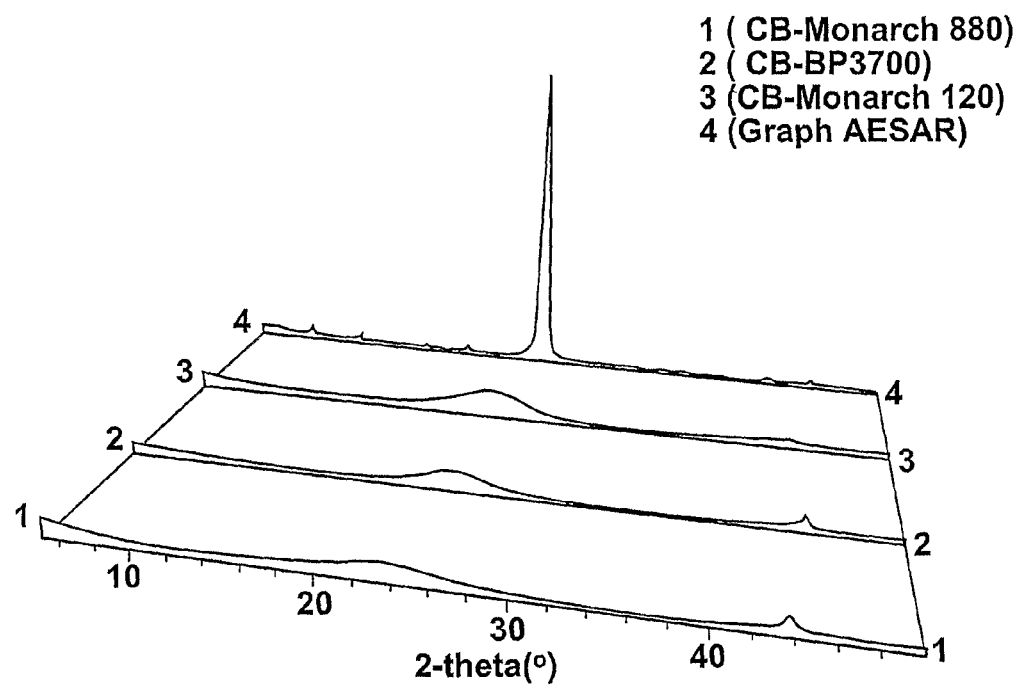
FIG. 3 is a XRD Spectra of various carbon powder sources used in the synthesis of SWNT.
Figure 4:
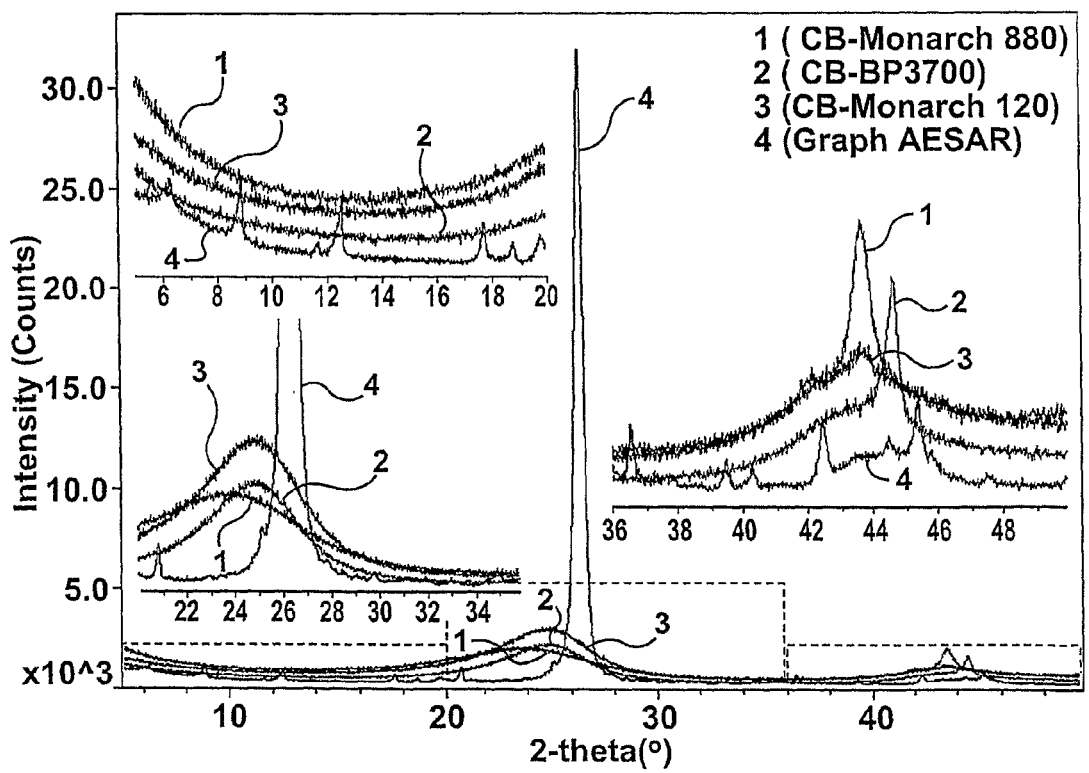
FIG. 4 is an XRD Spectra of various carbon powder sources used in the synthesis of SWNT.

Four different types of carbon sources have been used during the experiments of SWNT synthesis by induction plasma. Overall the results have shown that the graphitization degree of the powder and their physical properties present a remarkable and distinct influence on the final structure of the carbon powder produced. FIGS. 3 and 4 depict comparison images of XRD spectra of the various carbon powder sources used.

Two XRD peaks can be easily identified at 2θ equals to 26 and 45. It can be seen that the degree of graphitization of the powder increases from CB-Monarch 120, CB-Monarch 880, CB-BP3700, to G-Aesar.

From images it is clear that G-Aesar are carbon powders composed by well-ordered graphitic structures, while CB-Monarch 120 and CB-Monarch 880 are composed by amorphous carbon. In turn, although CB-BP3700 is mainly composed by amorphous carbon, its crystal structure shows a higher graphitization degree than CB-Monarch 120 and CB-Monarch 880 as depicted in the peak at 45.

Table 2 shows some physical properties of the various carbon sources and a general evaluation of their performance on the synthesis of carbon nanostructures.

TABLE 2

Physical Properties of Carbon Powder Sources and Their Overall Performances in the Synthesis of Carbon Nanostructures

| Material | Particle Size | Surface Area ($m^2/g$) | Density ($g/cm^3$) | Fullerene Content (% wt) | Synthesized Nanostructures |
|---|---|---|---|---|---|
| CB Monarch 280 (fluffy) | 45 um | 42 | 0.14 | 7.4 | Multi and single wall nanotubes (high concentration) |
| CB Monarch 120 (fluffy) | 75 um | 25 | 0.24 | 7.7 | Multi and single wall nanotubes (high concentration) |
| CB Monarch 880 (fluffy) | 16 um | 220 | 0.13 | 6.2 | Nano-onions, some nanofibers and some multi wall nanotubes |
| CB BP3700 (pellets) | 37 um | 85 | 0.35 | 3.9 | Nano-onions, polyhedral structures, some short multi wall nanotubes. |

TABLE 2-continued

Physical Properties of Carbon Powder Sources and Their Overall Performances in the Synthesis of Carbon Nanostructures

| Material | Particle Size | Surface Area ($m^2/g$) | Density ($g/cm^3$) | Fullerene Content (% wt) | Synthesized Nanostructures |
|---|---|---|---|---|---|
| G-Aesar (particles) | −325 mesh (<45 um) | unknown | unknown | 2.1 | Nothing |

Notations
CB Carbon Black
G Graphite

It will be shown later that the type and the concentration of the synthesized carbon nanostructures depend on the physical properties of the carbon powder source, such as particle size, density and morphology, and more specifically, on the graphitization degree.

Catalysts

Various types and sizes of catalyst particles have been used during the experiments of SWNT synthesis by induction plasma.

Overall the results have shown that the particle size and the mixtures of catalysts have remarkable and distinct influences on the final structure of the carbon powder produced.

Table 3 shows some overall relationships between the type and size of catalysts, and the type of carbon source with the sort of the carbon nanostructure produced.

Specific examples can be found in the next two following sections.

Experimental Tests Producing SWNT

Example 1

CB—Ni—$CeO_2$ Mixture Using Hot Reactor Walls (NQ60)

A mixture containing carbon black powder and catalyst particles were treated by induction plasma at 40 kW of plate power. The reactant mixture was prepared using carbon black (Monarch 120 from Cabot, Inc., fluffy powder, SA=25 $m^2/g$, PS=75 nm, ρ=0.24 $g/cm^3$) as carbonaceous source and nickel (Ni, 99.5%, <1 μm) and cerium oxide ($CeO_2$, 99.9%, −325 mesh) as catalysts.

The powders were well mixed using a rotary mixer at 60 rpm during 20 min. The final catalyst concentration of the mixture was 1.2 mol % of Ni and 0.2 mol % of $CeO_2$.

TABLE 3

Influence of Catalyst Powders in the Synthesis of Carbon Nanostructures

| Catalyst | Particle Size | Carbon Source | Fullerene Content (% wt) | Synthesized Nanostructures |
|---|---|---|---|---|
| Nothing | — | CB3700 | 0.6 | Nothing |
| Nothing | — | CB Monarch 280 | 1.6 | Some Nanoonions |
| Ni | <45 um | CB BP3700 (pellets) | 2.1 | Nano-onions, polyhedral structures and some short multi wall nanotubes |
| Ni | <1 um | CB Monarch 120 (fluffy) | 7.7 | Nano-onions, multi wall nanotubes and some single wall nanotubes (low concentration) |
| Fe | 5-25 um | CB BP3700 (pellets) | 1.0 | Some nano-onions, some nanofibers |
| Fe | <4-5 um | CB Monarch 120 (fluffy) | 7.4 | Nano-onions, nanofibers, some multi wall nanotubes. |
| Ni—$Y_2O_3$ | Ni < 45 um $Y_2O_3$ < 45 um | CB BP3700 (pellets) | 0.0 | Nothing |
| Ni—$CeO_2$ | Ni < 1 um $CeO_2$ < 45 um | CB Monarch 280 (fluffy) | 7.0 | Single wall nanotubes (high concentration) |
| Ni—$CeO_2$ | Ni < 1 um $CeO_2$ < 45 um | CB Monarch 120 (fluffy) | NA | Single wall nanotubes (low concentration) |
| Ni—$CeO_2$ | Ni < 1 um $CeO_2$ < 45 um | CB Monarch 880 (fluffy) | NA | Nothing |
| Ni—$CeO_2$ | Ni < 1 um $CeO_2$ < 45 um | CB Monarch 120 (fluffy) | NA | Single wall nanotubes (high concentration with hot walls) |
| Ni—$CeO_2$ | Ni < 1 um $CeO_2$ < 45 um | Graphite Aesar | 2.1 | Nothing |
| Fe—$CeO_2$ | Fe < 4-5 um $CeO_2$ < 45 um | Graphite | 2.0 | Nanofibers (high concentration) |
| Ni—Co | Ni < 1 um Co < 2 um | CB Monarch 120 (fluffy) | NA | Single wall nanotubes (high concentration with hot walls) |

Notations
CB Carbon Black
G Graphite
NA Not Analyzed

In this test, a graphite insert tube 66 (95-mm id, 125-mm od and 500-mm length) was introduced into the reactor 24 to maintain a high temperature environment in the reaction zone. Before feeding the raw material mixture, reactor temperature was stabilized using argon-hydrogen plasma during 15 minutes. In this preheating stage, plasma-operating conditions were: a 90-slpm Ar and 8-slpm $H_2$ gas mixture in the sheath gas, 35-slpm of Ar in the central gas, 12-slpm of Ar in the powder gas, 40-kW of plate power, and 66-kPa of reactor pressure.

After the stabilization period, plasma conditions were changed in order to reach the parameters shown in the experimental setup section. The raw material mixture was fed to the plasma torch at 0.8 g/min. The plasma reactor pressure was essentially isobaric at 66 kPa. A rapid quenching of the carbon vapor by the cooled walls of the quenching and filters produced very light condensed soot, which was recovered from the system walls and the filtration section. The recovered soot also presented a rubber-like morphology.

After ten minutes run under these conditions, a total of 6.0 g of SWNT containing soot was recovered from system walls and the filters.

A Raman spectroscopy analysis was also performed to confirm the synthesis of SWNT. The result was compared with the Raman spectra obtained from laser (SIMS-NRC, reference: Kingston et al. Carbon 42, 1657, 2004) and NQ11 soot samples. Test NQ11 was performed using the same operating conditions as test NQ60 but with water-cooled reactor walls (no graphite insert tube 66).

Figure 5:
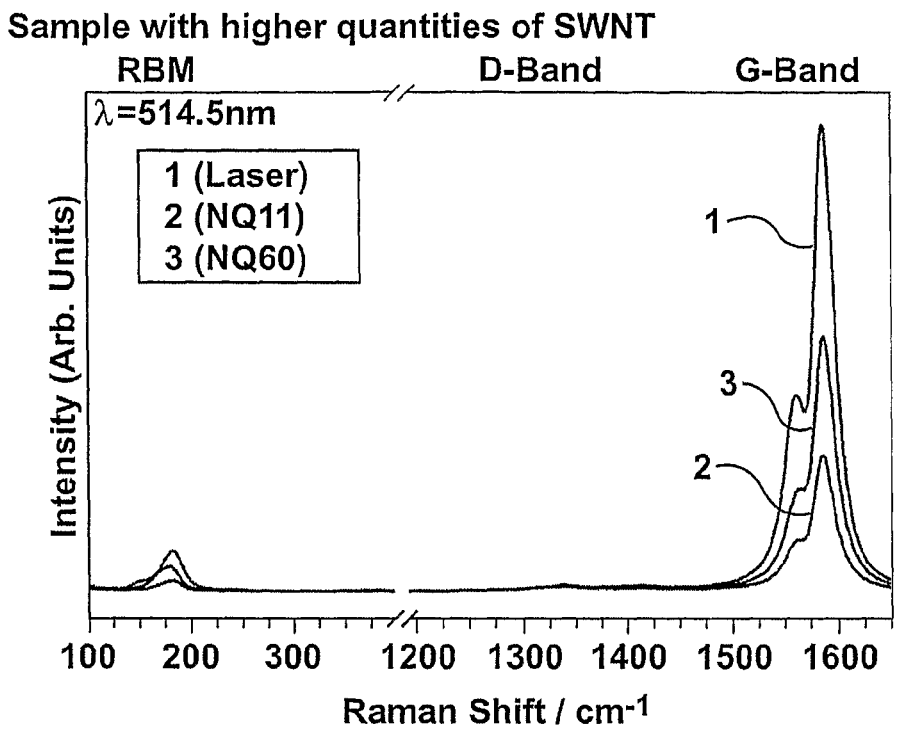
FIG. 5 Raman Spectrum ($\lambda ex=514.5$ nm) of SWNT Containing Soot Produced using CB Monarch 120-Ni—$CeO_2$ Mixture as Starting Material (Hot Reactor Walls)

FIG. 5 depicts a Raman spectra comparison of the three SWNT containing soot samples.

It can be seen that the use of hot walls in the reaction zone distinctly enhances the synthesis of SWNT.

Although the concentration of SWNT in the NQ60 sample is lower than that produced with the laser technique, it is also twice higher than that produced in NQ11 test, in which water-cooled rector walls were used at the same operating conditions.

This result confirms, in some manner, the findings obtained in laser experiments, in which large resident times of carbon species at high temperatures favour the synthesis of SWNT.

Example 2

CB—Ni—$CeO_2$ Mixture Using Hot Reactor Walls (NQ61)

This test was specifically performed to reproduce NQ60 results in a long-duration experiment, in which the plasma system was operated in a continuous regime.

As previously described, a mixture containing carbon black powder and catalyst particles were treated by induction plasma at 40 kW of plate power. The reactant mixture was prepared using carbon black (same as Example 1, Monarch 120 from Cabot, Inc., fluffy powder, SA=25 $m^2$/g, PS=75 nm, $\rho$=0.24 g/$cm^3$) as carbonaceous source and nickel (Ni, 99.5%, <1 μm) and cerium oxide ($CeO_2$, 99.9%, −325 mesh) as catalysts.

The powders were well mixed using a rotary mixer at 60 rpm during 20 min. The final catalyst concentration of the mixture was 1.2% mol of Ni and 0.2% mol of $CeO_2$.

A graphite insert tube 66 (95-mm id, 125-mm od and 500-mm length) was also introduced into the reactor 24 to maintain a high temperature environment in the reaction zone. Before feeding the raw material mixture, reactor temperature was also stabilized using argon-hydrogen at the same operating conditions described in the NQ60 experiment, i.e.

90-slpm Ar and 8-slpm $H_2$ gas mixture in the sheath gas, 35-slpm of Ar in the central gas, 12-slpm of Ar in the powder gas, 40-kW of plate power, 66-kPa of reactor pressure, temperature stabilization time of 15 min.

After the stabilization period, plasma conditions were changed in order to reach the parameters shown in the experimental setup section. The raw material mixture was, then, fed to the plasma torch at 1.0-g/min using a Sylco MARX IX (serial 579) powder feeder. The plasma reactor pressure was essentially isobaric at 66 kPa. A rapid quenching of the carbon vapor by the cooled walls of the quenching system produced very light condensed soot, which was recovered from the system walls and the filtration section.

After 4.5-h of operation (about 270-g of raw mixture feeding) under these conditions, a total of 220-g of soot was recovered from system walls and the filters. Two blowback periods of 2 minutes were applied at intervals of 2.0 h.

As in the previously described experiment, a Raman spectroscopy analysis of the SWNT containing soot was also performed and compared with Raman spectrum obtained from laser and NQ60 soot samples. Raman spectra for the SWNT containing soot collected from different parts of the reactor were carried out. The results showed that SWNT are present in all of the materials collected from different parts of the reactor. SWNT concentration was slightly higher in the soot collected from the filter than that found in the reactor.

Figure 6:
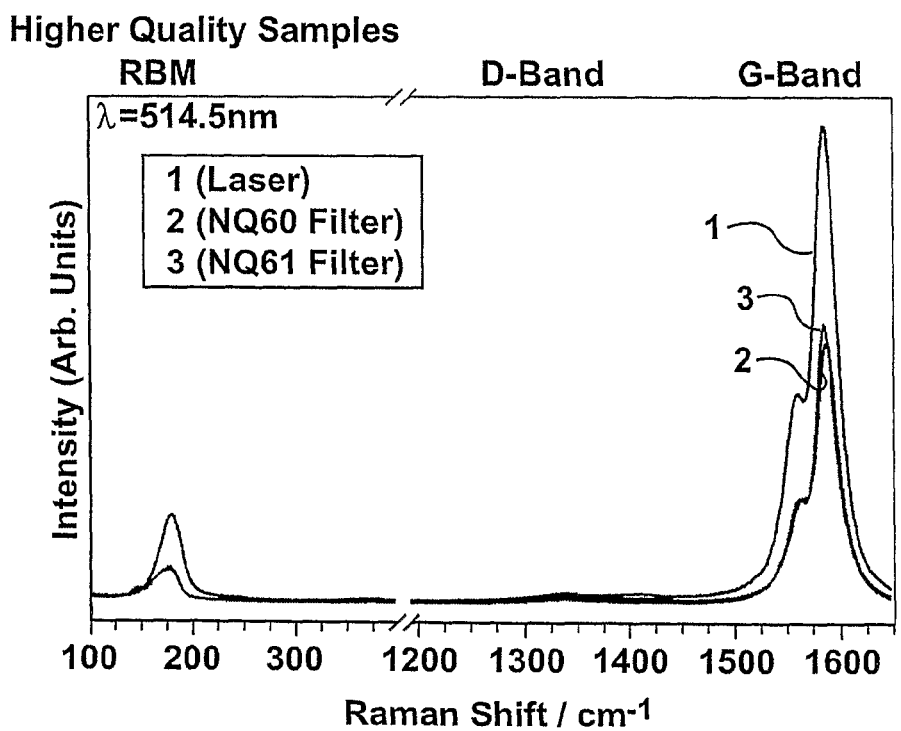
FIG. 6 Raman Spectrum ($\lambda ex=514.5$ nm) of SWNT Containing Soot Produced using CB Monarch 120-Ni—$CeO_2$ Mixture as Starting Material (Hot Reactor Walls)

FIG. 6 depicts Raman spectra of the SWNT containing soot of the three experiments.

It can be seen that the Raman spectrum of the soot collected in NQ61-filters is essentially identical to the NQ60-filters Raman spectra.

Two different TGA analyses were also performed on the soot collected from filters. In the first TGA analysis, air was used for carbon oxidation, while $CO_2$ was used in the second analysis in order to slow down the soot oxidation step. Although the same three separate oxidation events can be easily identified in both analyses, the TGA analysis using $CO_2$ allowed performing better Gaussians fits to the oxidation events.

Figure 7:
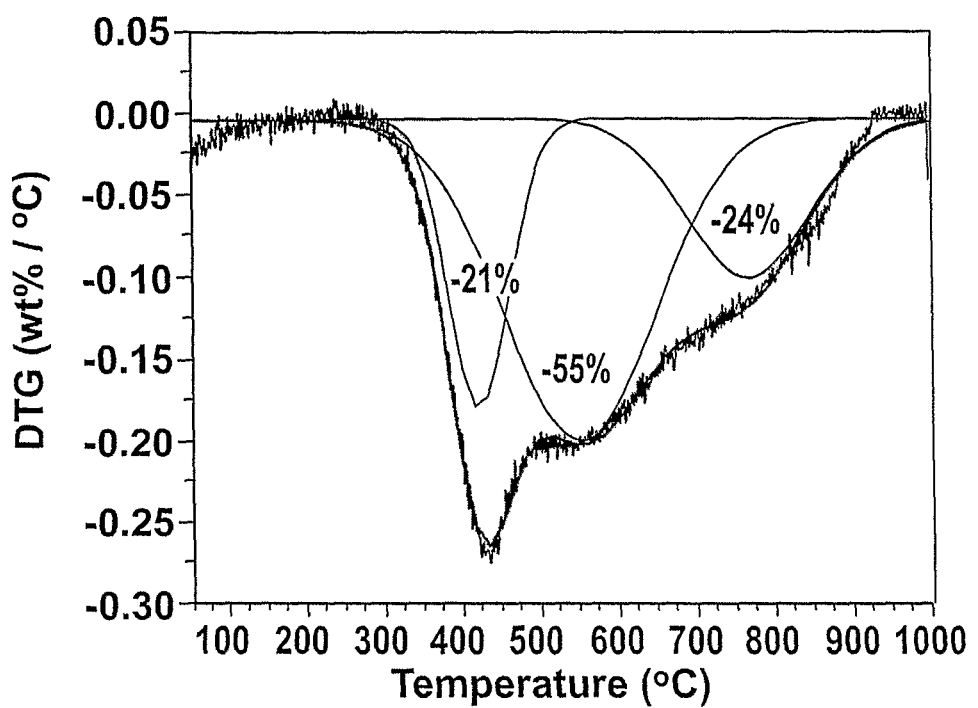
FIG. 7 DTG Analysis Data in $CO_2$ of SWNT Containing Soot produced using CB Monarch 120-Ni—$CeO_2$ Mixture as Starting Material (Hot Reactor Walls), and Its Corresponding Gaussian Fits.

FIG. 7 depicts DTG and DTG Gaussian fits of the SWNT containing soot recovered from filters. The results show that about 25-wt % of SWNT was successfully produced.

Therefore, this experimental test decisively allows confirming that the plasma reactor is able to work well in a continuous regime, with quite high output, and is reliably repetitive and reproducible.

Example 3

CB—Ni—Co Mixture Using Hot Reactor Walls (NQ69)

A mixture containing carbon black powder and catalyst particles was treated by induction plasma at 40 kW of plate power. The reactant mixture was prepared using carbon black (same as Examples 1 and 2, Monarch 120 from Cabot, Inc., fluffy powder, SA=25 $m^2$/g, PS=75 nm, $\rho$=0.24 g/$cm^3$) as carbonaceous source and nickel (Ni, 99.5%, <1 μm) and cobalt (Co, 99.8%, <2 μm) as catalysts.

The powders were well mixed using a rotary mixer at 60 rpm during 20 min. The final catalyst concentration of the mixture was 0.6 mol % of Ni and 0.6 mol % of Co.

A graphite insert tube 66 (95-mm id, 125-mm od and 500-mm length) was also introduced into the reactor 24 to maintain a high temperature environment in the reaction zone. Before feeding the raw material mixture, reactor temperature was also stabilized using argon-hydrogen at the same operating conditions described in the NQ60 experiment, i.e. 90-slpm Ar and 8-slpm $H_2$ gas mixture in the sheath gas, 35-slpm of Ar in the central gas, 12-slpm of Ar in the powder gas, 40-kW of plate power, 66-kPa of reactor pressure, temperature stabilization time of 15 min.

After the stabilization period, plasma conditions were changed in order to reach the parameters shown in the experimental setup section. The raw material mixture was fed to the plasma torch at 1.2 g/min. The plasma reactor pressure was essentially isobaric at 66 kPa. A rapid quenching of the carbon vapor by the cooled walls of the quenching and filters produced very light condensed soot, which was recovered from the system walls and the filtration section in form of big rubber-like sheets.

After fifteen minutes run under these conditions, a total of 16.5 g of SWNT containing soot was collected from system walls and the filters.

SEM images were taken from two different sample preparations. While the first series of images was taken from small pieces of as-produced SWNT containing soot, the second series was taken after soot was dispersed in ethanol using an ultrasonic bath for 5 min.

Due to the rubber-like consistency of the soot, its dispersion in ethanol was relatively difficult to achieve (usually, soot dispersion takes 1-2 min).

Figure 8A:
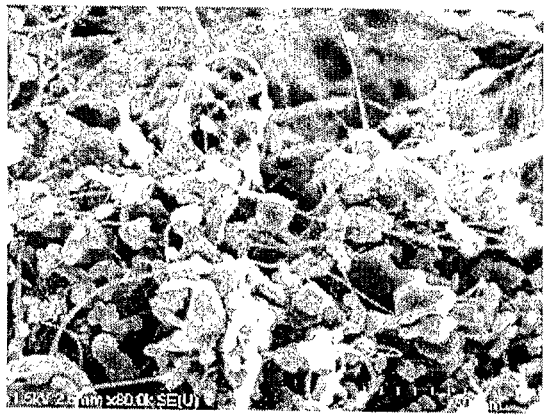
FIG. 8 SEM Images of as-Produced SWNT Containing Soot Agglomerates Produced using CB Monarch 120-Ni—Co Mixture as Starting Material (Hot Reactor Walls). (a) and (b) As-Produced SWNT, (c) and (d) Well-Dispersed SWNT.
Figure 8B:
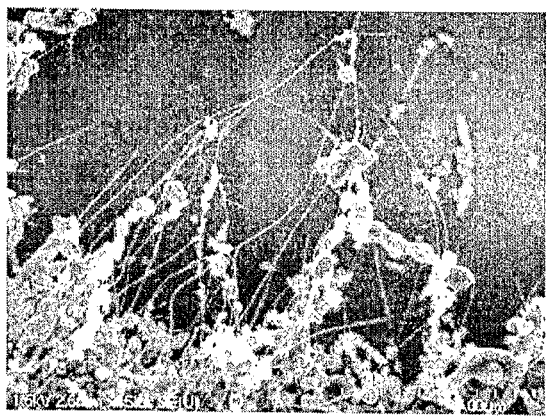
Figure 8C:
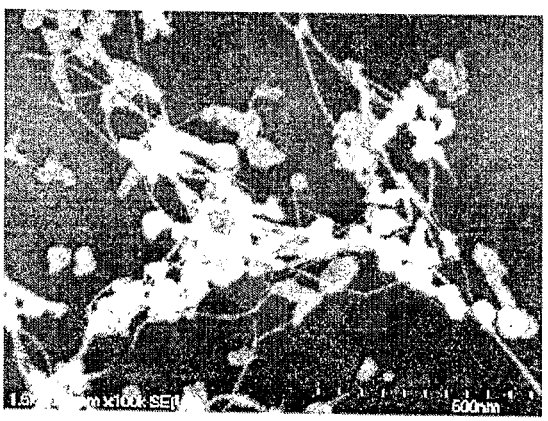
Figure 8D:
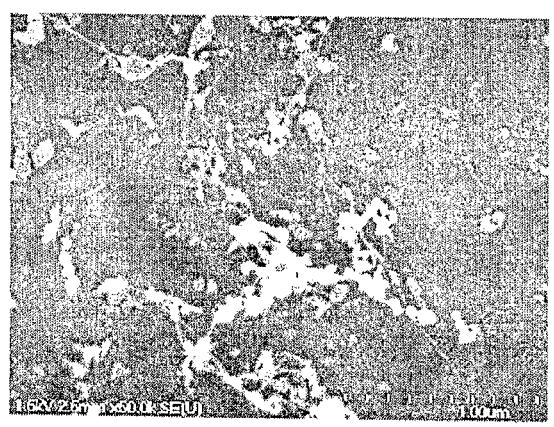
Figure 9A:
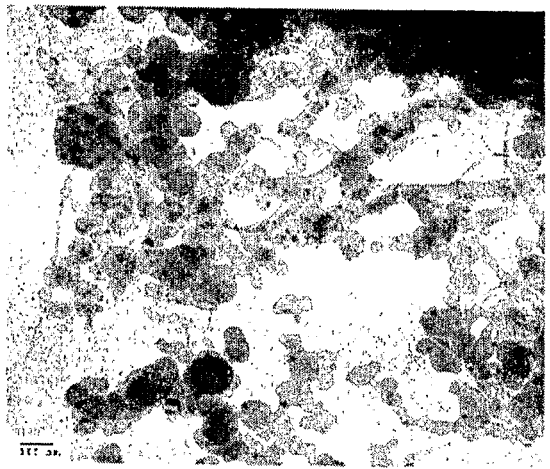
FIG. 9 TEM Images of SWNT Containing Soot Produced using CB Monarch 120-Ni—Co Mixture as Starting Material (Hot Reactor Walls). (a) and (b) Low and (c) and (d) High Magnification Micrographs.
Figure 9B:
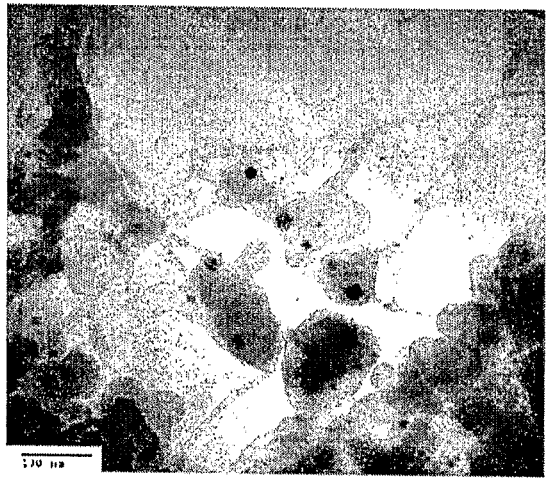
Figure 9C:
Figure 9D:
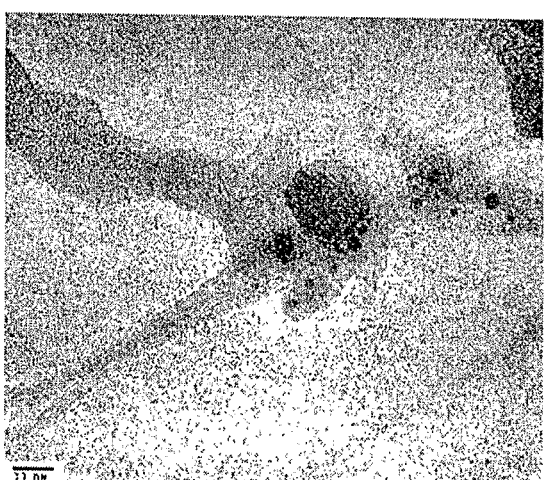

FIGS. 8a and 8b show SEM images of the as-produced soot collected from filters. FIG. 8a shows the presence of SWNT entangled with large carbon particles, making difficult SWNT identification. SWNT identification was easily to achieve when SEM observations were performed on the edges of the as-produced soot agglomerates, as shown FIG. 8b. In contrast, FIGS. 8c and 8d show SEM images of well-dispersed SWNT containing soot. While outside diameters of various sizes can be identified in the SWNT, their lengths can reach several hundreds of nanometers.

FIG. 9 shows various TEM images of the soot collected in the filters. A quite high concentration of SWNT can be also determined in these images. As expected, high resolution micrographs (FIGS. 9c and d) show that fat nanotubes are composed of SWNT bundles. These nanotubes present quite homogenous diameters. Outside diameters of SWNT bundles were estimated to be from 3 to 8 nm.

Figure 10:
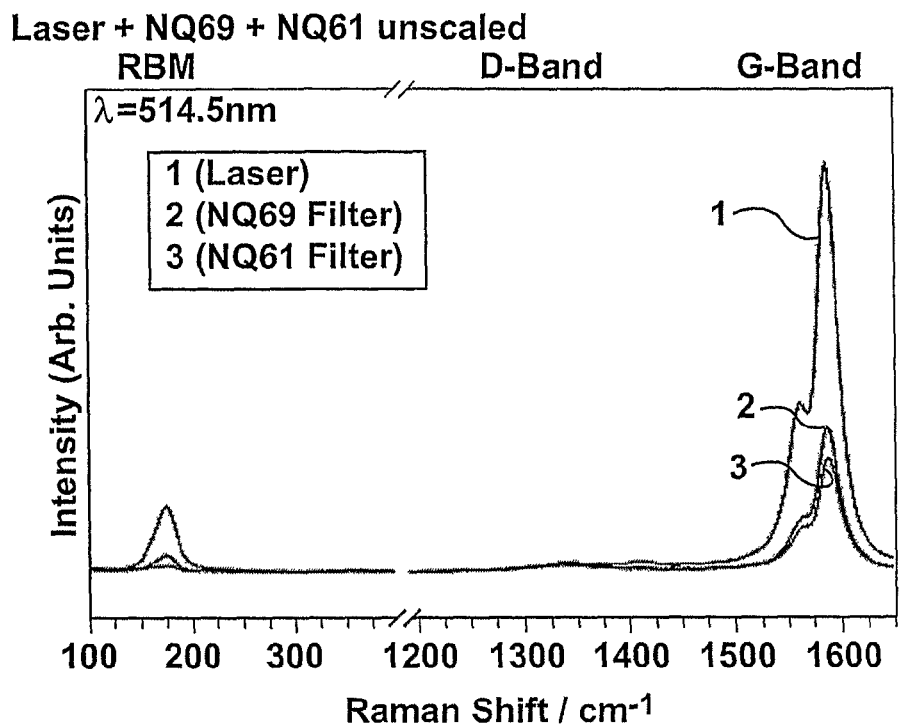
FIG. 10 Raman Spectrum ($\lambda$ex=514.5 µm) of SWNT Containing Soot Produced using CB Monarch 120-Ni—Co Mixture as Starting Material (Hot Reactor Walls)

As usual, a Raman spectroscopy analysis of the SWNT containing soot was also performed and compared with Raman spectrum obtained from laser and NQ61 soot samples. FIG. 10 depicts Raman spectra of the SWNT containing soot of the three experiments. The result clearly shows that Ni—Co catalyst mixture significantly enhances the synthesis of SWNT, when compare with the result obtained from NQ61. Taking into account that NQ61 produced an average SWNT content of 25-wt %, it can be assumed that the SWNT content synthesized in the NQ69 test might reach up to 30 wt %.

Experimental Tests Producing Various Graphitic Structures without SWNT

Example 4

CB—Ni—$CeO_2$ Mixture Using Water-Cooled Reactor Walls (NQ55)

A mixture containing carbon black powder and catalyst particles were treated by induction plasma at 40 kW of plate power. The reactant mixture was prepared using carbon black (Monarch 880 from Cabot, Inc., fluffy powder, SA=210 $m^2/g$, PS=17 nm, $\rho$=0.24 $g/cm^3$) as carbonaceous source and nickel (Ni, 99.5%, <1 μm) and cerium oxide ($CeO_2$, 99.9%, −325 mesh) as catalysts.

Figure 11:
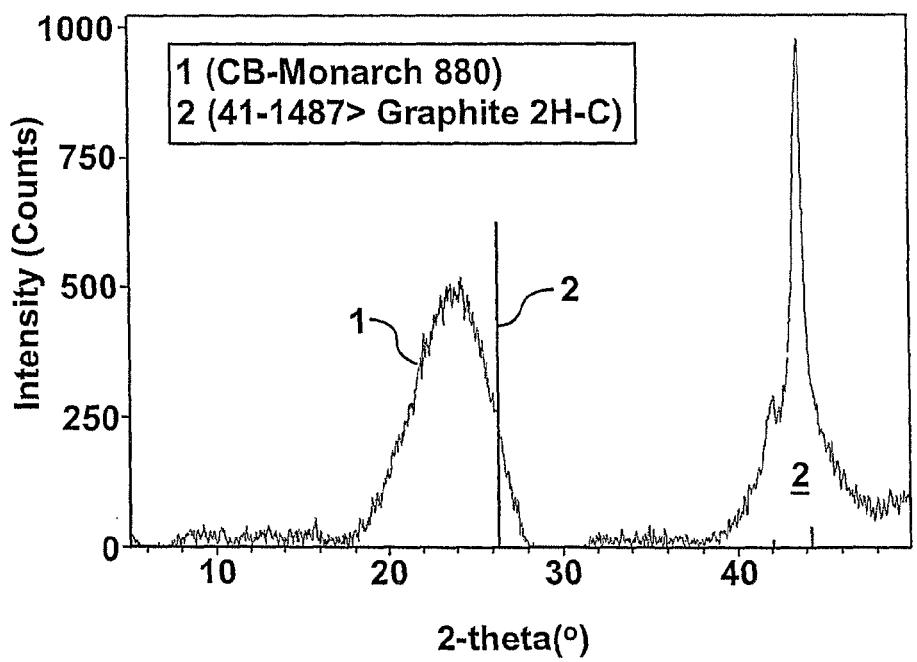
FIG. 11 XRD Analysis of Carbon Black Monarch 880 from Cabot, Inc.
Figure 12:
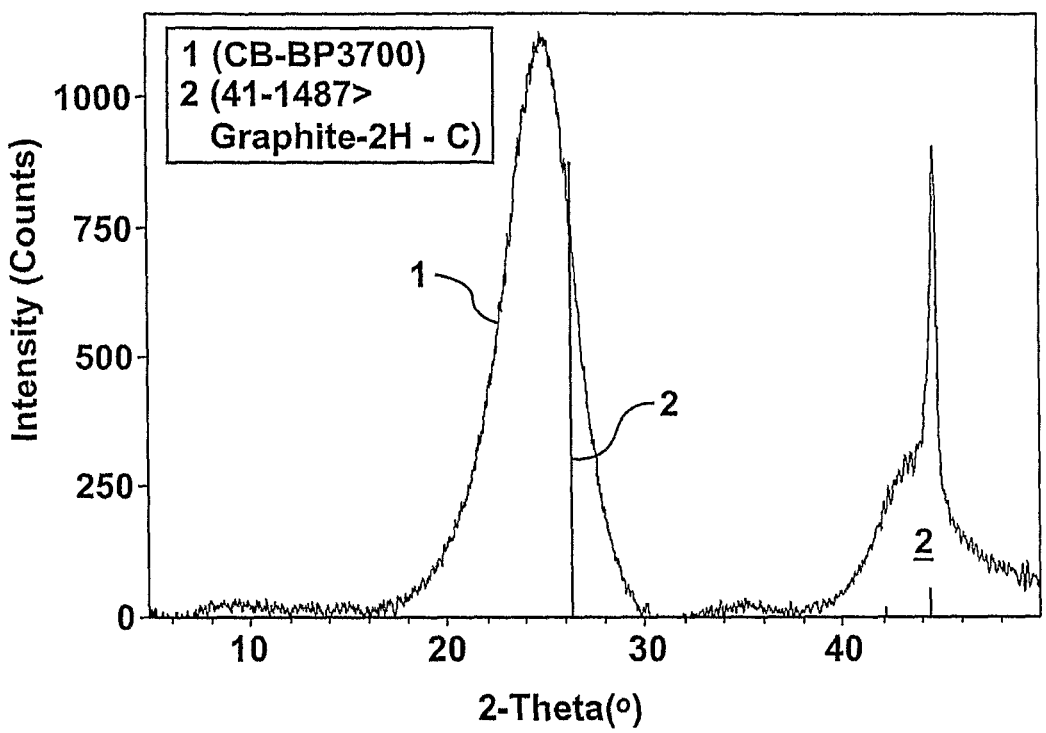
FIG. 12 XRD Analysis of Carbon Black BP3700 from Cabot, Inc.
Figure 13:
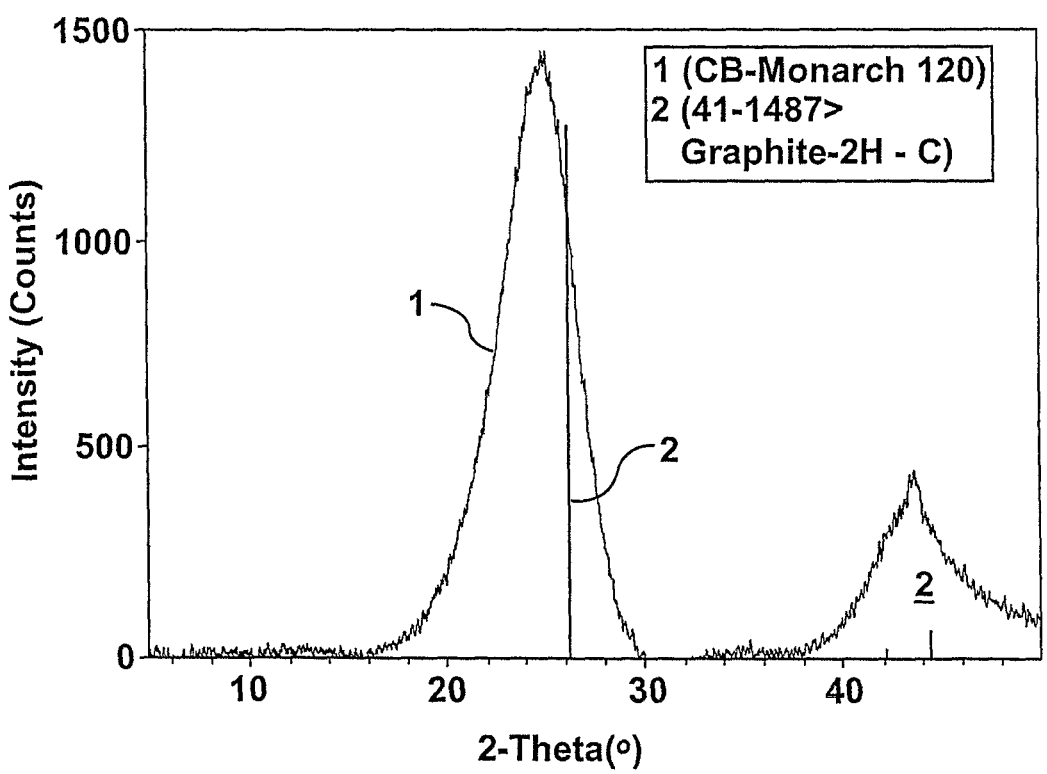
FIG. 13 XRD Analysis of Carbon Black Monarch 120 from Cabot, Inc.

FIGS. 11, 12 and 13 show XRD analyses of the carbon black powders, Monarch 880, BP3700 and Monarch 120, before plasma treatment, respectively. Very low intensities of the graphite crystallographic peaks, at 2θ equal 26 and 45, can be seen in all spectra, showing that all powders are mainly composed of amorphous carbon. However, it can be seen that the graphitization degree of Monarch 880 and BP3700 might be quite similar due to the intensity level measured at 45, which is almost twice than that observed for Monarch 120. Therefore, a similar physicochemical behaviour can be expected on both powders during the synthesis of SWNT.

The powders were well mixed using a rotary mixer at 60 rpm during 20 min. The final catalyst concentration of the mixture was 1.2% mol of Ni and 0.2% mol of $CeO_2$. The raw material mixture was fed to the plasma torch at 1.5 g/min. The operating conditions of the plasma torch were maintained as shown in the experimental setup section. The plasma reactor pressure was essentially isobaric at 70 kPa. A rapid quenching of the carbon vapour by the cooled walls of the system produced very light condensed soot, which was recovered from the system walls and the filtration section.

After twenty minutes run under these conditions, a total of 19.0 g of fullerenic soot was recovered from system walls and the filters.

Figure 14:
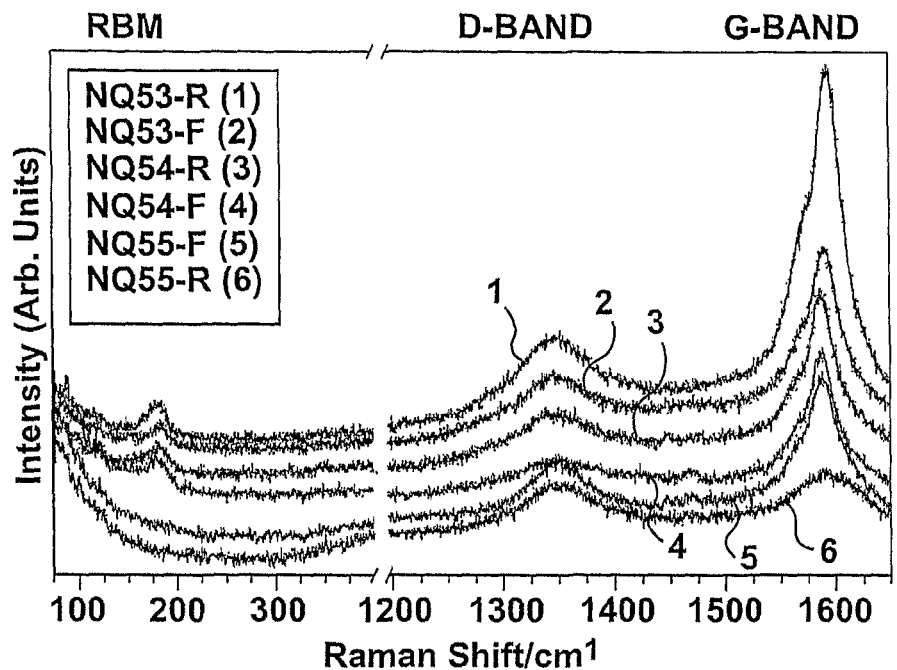
FIG. 14 Raman Spectrum ($\lambda$ex=514.5 nm) of Soot Produced using CB Monarch 880-Ni—$CeO_2$ Mixture as Starting Material (Water-Cooled Reactor Walls)

FIG. 14 depicts the Raman spectra for the soot produced in experiment NQ55. The labels "F" and "R" indicate soot was collected from the filtration 28 and reactor 24 systems, respectively. Comparison is made to samples from two other experiments, NQ53 and NQ54, in which the same operating conditions were used with carbon black Monarch 120 in place of carbon black Monarch 880. The Raman analysis shows that SWNT were not synthesized for test NQ55, compared to small quantities of SWNT for tests NQ53 and NQ54.

This result confirms, in some manner, the preliminary observation regarding the influence of the graphitization degree of the carbon raw material on the final structures of the synthesized powder.

Plasma operating conditions (the type and flow rate of plasma gases, plate power, and reactor pressure) were established as the optimal conditions, after a series of experiments, which were mainly focused to optimize the vaporization of carbon black.

The induction plasma system is able to produce SWNT as a result of a special combination of parameters, such as plasma conditions, binary catalyst mixture, type of carbon source, hot walls and temperature gradients, reactor pressure, etc. For example, in the examples 1 to 3 (test producing SWNT) we have used almost the same conditions as example 4 (test not producing SWNT). The differences are related to the carbon source and reactor wall temperature. While examples 1-3 used carbon black monarch 120, example 4 used monarch 880. The results demonstrated that the graphitization of the carbon powder is a very important parameter.

In addition, the selection of catalysts used is also very important, including the particle size of the catalysts which is preferably smaller than 5 μm and finally, it was observed that experiments conducted with hot walls in the reactor produced better results than those where the walls of the reactor are water cooled. Additional experiments were conducted that demonstrate that metal oxide catalysts instead of pure metals have a very positive effect on the quality of the SWNT. In these experiments, the quantities of oxide powders (NiO and $CO_3O_4$) added to the mixture were such that the total amount of metal (Ni and Co) was the same as in a reference standard.

The mechanism appears to be as follows:

It is known that metal oxides catalyze carbon particle gasification thereby increasing the carbon vapour pressure in the plasma reactor. In addition, because metal oxides present lower melting and vaporization points than their pure homologues, gaseous metal particles are more easily produced in the plasma tail. The reaction involved is the high temperature reduction of the metal oxide by carbon particles to produce pure gaseous metal species. In this way, carbon particles are better vaporized at low temperatures and the carbon gaseous products spend more time at the higher temperatures in the plasma reactor, which favours formation reactions of SWNT. It is also possible that the release of oxygen from the reduced metal oxides may contribute to the selectivity of producing SWNT by impeding the formation of other forms of carbon.

Still more experiments conducted using Cobalt and Nickel with either $Y_2O_3$ or $CeO_2$ also improved results. Thus a third metal oxide catalyst was found to be desirable.

Since radiative transport is believed to be an important feature of heat transfer in thermal plasmas, plasma radiation might have an important influence in the catalysis of SWNT. Additionally, metallic vapours radiate much more than the regular Ar and He gases used in a plasma induction furnace. Thus, small additions of Ni, Co, Y and Ce will not only affect the thermodynamic and transport properties of the plasma, but also its radiative emission. According to Essoltani et al. (*Plasma Chem Plasma Proc.* 14, 3, 301; 14, 4, 437 1994), the contribution of Fe vapours to the total plasma radiation is orders of magnitude stronger than Ar, at low temperatures (<7000 μL). This is due to the low ionization potential of Fe. Because of the low ionization potential of Ce 5 (0.54 eV), Y (6.22 eV) compared to Ni (7.64 eV), Co (7.88 eV), Ar (15.76 eV), and He (24.59 eV), it is justifiable to assume that the use of Ce or Y will increase the radiative emission of the plasma. Thus, photocatalytic reactions of carbon species might also be produced by the intense plasma radiation.

Experimental Test Producing High Yield of SWNT.

Example 5

CB—Co—Ni—$Y_2O_3$ Mixture Using Hot Reactor Walls (US-NRC-50)

A mixture containing carbon black powder and catalyst particles were treated by induction plasma at 40 kW of plate power. The reactant mixture was prepared using carbon black (Monarch 120 from Cabot, Inc., fluffy powder, SA=25 m$^2$/g, PS=75 μm, ρ=0.24 g/cm$^3$) as carbonaceous source and cobalt (Co, 99.8%, <2 μm) nickel (Ni, 99.5%, <1 μm) and yttrium oxide ($Y_2O_3$, 99.9%, −325 mesh) as catalysts.

The powders were well mixed using a rotary mixer at 60 rpm during 20 min. The final catalyst concentration of the mixture was 0.6 mol % of Co, 0.6 mol % of Ni, and 0.4 mol % of $Y_2O_3$.

In this test, a graphite insert tube 66 (95-mm id, 125-mm od and 500-mm length) was introduced into the reactor 24 to maintain a high temperature environment in the reaction zone. Before feeding the raw material mixture, reactor temperature was stabilized using argon-hydrogen plasma during 15 minutes. In this preheating stage, plasma-operating conditions were: a 90-slpm Ar and 8-slpm $H_2$ gas mixture in the sheath gas, 35-slpm of Ar in the central gas, 12-slpm of Ar in the powder gas, 40-kW of plate power, and 66-kPa of reactor pressure.

After the stabilization period, plasma conditions were changed in order to reach the parameters shown in the experimental setup section. The raw material mixture was fed to the plasma torch at 1.9 g/min. The plasma reactor pressure was essentially isobaric at 66 kPa. A rapid quenching of the carbon vapor by the cooled walls of the quenching and filters produced very light condensed soot, which was recovered from the system walls and the filtration section. The recovered soot also presented a rubber-like morphology.

After 14.5 minutes run under these conditions, a total of 17.5 g of SWNT containing soot was recovered from system walls and the filters.

A Raman spectroscopy analysis was also performed to confirm the synthesis of SWNT. The result was compared with the Raman spectra obtained from laser (SIMS-NRC, reference: Kingston et al. Carbon 42, 1657, 2004) and NQ69 (Example 3, performed under the similar conditions except using two catalyst species) soot samples.

Figure 15:
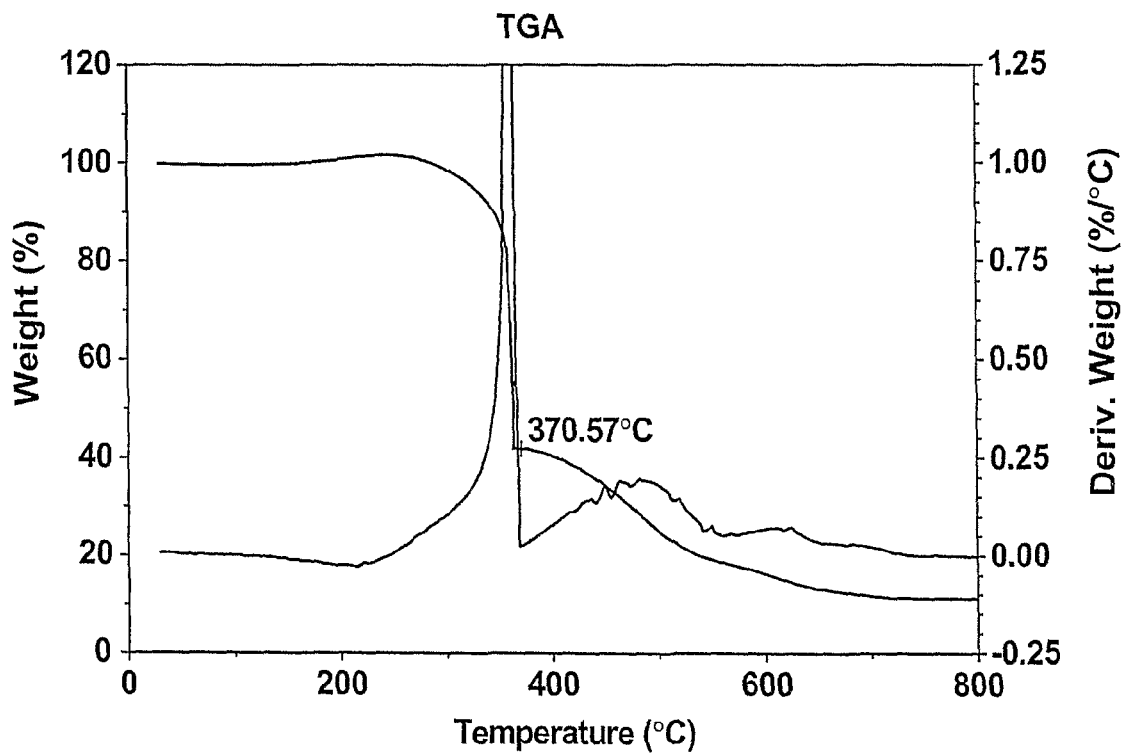
FIG. 15 Raman Spectrum ($\lambda$ex=514.5 nm) of SWNT Containing Soot Produced using CB Monarch 120-Ni—Co—$Y_2O_3$ Mixture as Starting Material (Hot Reactor Walls)

FIG. 15 depicts a Raman spectra comparison of the three SWNT containing soot samples. The spectra have been normalized to the intensity of the G-band feature to allow comparison of the D-band features, which indicates impurity carbon and defects in the SWNT structure. Test US-NRC-50 shows a substantial decrease in the intensity and width of the D-band compared to NQ69, and is only marginally broader than the D-band of the laser material.

This result illustrates the benefit of using a mixture of three catalysts for the production of high yields of high quality SWNT.

INDUSTRIAL APPLICABILITY

It will be appreciated by those skilled in the art that an induction plasma torch provides such high temperatures that direct observation of the mechanisms favourable to the production of single-walled carbon nanotubes cannot be performed. Further work is contemplated to better identify operating conditions which favour the efficient generation of single-walled carbon nanotubes. However, it is expected that the catalysts play a key role in establishing appropriate plasma conditions via some radiative process which contributes to the creation of appropriate density and temperature gradients for stabilizing the plasma. While the specific reactor configuration may change, the invention has been shown to provide means for the continuous production of a soot containing single-walled carbon nanotubes in significant quantities.

It will be appreciated that several variations may be made to the reactor while preserving such features as the location and distribution of access ports in the reactor and to the length, diameter and thickness of the graphite walls for creating the appropriate hot walls conducive to the production of single-walled carbon nanotubes. All such variations, as will be readily apparent to those skilled in the art, are contemplated with the scope of this invention.

| INDEX OF REFERENCES CITED | |
|---|---|
| 20 | apparatus for swnt |
| 22 | plasma torch |
| 24 | reactor |
| 26 | quenching system |
| 28 | filtration system |
| 30 | collection system |
| 32 | five-turn induction coil |
| 34 | torch body |
| 36 | plasma confinement tube |
| 38 | cooling water inlet (plasma torch) |
| 40 | cooling water outlet (plasma torch) |
| 42 | gas distribution head |
| 44 | exit nozzle |

INDEX OF REFERENCES CITED

| | |
|---|---|
| 46 | central probe |
| 48 | intermediate tube |
| 50 | cooling water inlets (reactor and quenching system) |
| 52 | cooling water outlets (reactor and quenching system) |
| 54 | flanges |
| 56 | multi-access port |
| 58 | first segment quenching system |
| 60 | second segment quenching system |
| 62 | access ports |
| 64 | access ports |
| 66 | refractory insert tube |
| 68 | support bridle |
| 70 | filter unit |
| 72 | collection bucket |
| 74 | valve |
| 76 | arrow |
| 78 | access ports |
| 80 | elbow |
| 82 | tee |

The invention claimed is:

1. A method of producing single-walled carbon nanotubes in a reactor, the method comprising:
   (a) creating a plasma zone in a radio frequency (RF) inductively coupled plasma torch between a torch body and a central hollow probe of the plasma torch, the central hollow probe extending in an axial direction, wherein a stabilizing gas is introduced into the plasma torch to stabilize the plasma zone;
   (b) extending the plasma zone through a reactor body to produce a stable induction plasma in the reactor body to provide a continuous single source of heat and plasma conditions in the reactor body, the reactor body coupled in the axial direction to the torch body of the plasma torch, wherein a sheath gas is introduced into the plasma torch and extended into the reactor body to promote laminar flow in the reactor body to maintain the stable induction plasma;
   (c) providing the reactor body with a refractory insert tube having a pre-determined length, diameter, thickness and thermal conductivity to maintain temperatures and control temperature gradients produced by the induction plasma in the reactor body that favor production of C2 and/or C3 single-walled carbon nanotube precursors from the carbonaceous reactants, wherein the induction plasma is the sole source of heat in the reactor body;
   (d) feeding a catalyst and carbonaceous reactants into the central hollow probe along with a carrier gas for axial delivery of the carrier gas, catalyst and carbonaceous reactants into the plasma zone and then to the reactor body to produce single-walled carbon nanotubes from the reactants in the reactor body;
   (e) quenching growth of the single-walled carbon nanotubes in a quenching body, the quenching body coupled to the reactor body with the reactor body disposed between the torch body and the quenching body.

2. The method of claim 1, wherein the inductively coupled plasma torch is operated at 0.5 to 0.8 atmospheres of pressure.

3. The method of claim 1, wherein the inductively coupled plasma torch is operated at a power of 40 kW.

4. The method of claim 1, wherein the stabilizing gas is argon.

5. The method of claim 1, wherein the sheath gas is helium.

6. The method of claim 4, wherein the carrier gas is argon, the stabilizing gas is argon and the sheath gas is helium.

7. The method of claim 1, wherein the carbonaceous reactant is solid.

8. The method of claim 7, wherein the carbonaceous material is selected from the group consisting of carbon black, graphite and mixtures thereof.

9. The method of claim 1, wherein the catalyst is selected to enhance radiative properties in the induction plasma by higher emissivity and radiation coupling in the induction plasma.

10. The method of claim 9, wherein the catalyst is selected from the group consisting of at least two metals, at least two metal oxides, at least two metal salts and mixtures thereof.

11. The method of claim 10, wherein the selected catalyst contains at least one element selected from the group consisting of nickel, cobalt, cerium and yttrium.

12. The method of claim 1, wherein the refractory insert tube is made of graphite.

13. The method of claim 1, wherein laminar flow is maintained in the reactor body by providing the torch body and reactor body with pre-determined internal diameters $ID_1$ and $ID_2$, respectively, the ratio of $ID_1:ID_2$ being between 0.5 and 1.

14. The method of claim 1, wherein an inert gas is introduced into the quenching body to for cooling the reactants and terminating reactions.

15. The method of claim 1, wherein an oxidizing agent is introduced into the quenching body for selective oxidation of carbon soot at predetermined temperatures for purification of the single-walled carbon nanotubes.

16. The method of claim 15, wherein the oxidizing agent is selected from the group consisting of water, air, oxygen, ozone, carbon dioxide, and carbon monoxide.

17. The method of claim 1, wherein a functionalizing agent is introduced into the reactor body or quenching body to functionalize the single-walled carbon nanotubes.

18. The method of claim 17, wherein the functionalizing agent is selected from the group consisting of halogen compounds, alcohols, acids, organic chains and rings, amines, peroxide compounds and azo compounds.

19. The method of claim 1, wherein temperature gradients are controlled in the quenching body by lining the quenching body with at least one refractory tube of pre-determined length, diameter, thickness and thermal conductivity, the refractory tube extending along the length of the quenching body.

20. The method of claim 19, wherein a minimum exit temperature from the quenching body corresponding to a pre-determined residence time sufficient for growing single-walled carbon nanotubes is maintained by selecting a length of the quenching body.

21. The method of claim 1, wherein the single-walled carbon nanotubes are filtered in a filter assembly coupled to the quenching body by a transverse connection so as to be disposed in parallel to the reactor body and the quenching body for long-term continuous operation of the apparatus.

22. The method of claim 21, wherein the single-walled carbon nanotubes are collected in collection assembly disposed axially beneath the filter assembly to receive deposits released from the filter assembly, and access to the collection assembly is controlled by a valve disposed between the filter assembly and the collection assembly.

23. The method of claim 22, wherein gases are exhausted from the filter assembly by vacuum and single-walled carbon nanotube deposited on the filter assembly are blown back and collected by gravity into the collection assembly.

24. The method of claim 21, wherein the filter assembly has a porous material for retaining single-walled carbon nanotubes deposited in sheets at elevated temperatures.

* * * * *